(12) United States Patent
Hamada et al.

(10) Patent No.: US 7,198,992 B2
(45) Date of Patent: Apr. 3, 2007

(54) METHOD OF MANUFACTURING A SEMICONDUCTOR DEVICE COMPRISING DOPING STEPS USING GATE ELECTRODES AND RESISTS AS MASKS

(75) Inventors: Takashi Hamada, Kanagawa (JP); Satoshi Murakami, Kanagawa (JP); Shunpei Yamazaki, Tokyo (JP); Osamu Nakamura, Kanagawa (JP); Masayuki Kajiwara, Kanagawa (JP); Junichi Koezuka, Kanagawa (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/867,515

(22) Filed: Jun. 14, 2004

(65) Prior Publication Data

US 2004/0222425 A1    Nov. 11, 2004

Related U.S. Application Data

(63) Continuation of application No. 10/051,064, filed on Jan. 18, 2002, now Pat. No. 6,913,956.

(30) Foreign Application Priority Data

| Jan. 19, 2001 | (JP) | ............... 2001-11085 |
| Jan. 30, 2001 | (JP) | ............... 2001-22062 |

(51) Int. Cl.
  *H01L 21/00* (2006.01)
  *H01L 21/84* (2006.01)
(52) U.S. Cl. .............. 438/150; 438/151; 438/154; 438/486; 438/505; 438/549
(58) Field of Classification Search ............... 438/150, 438/151, 154, 486, 505, 549
See application file for complete search history.

(56) References Cited

U.S. PATENT DOCUMENTS 3,535,775 A    10/1970    Garfinkel et al. ............. 29/584

(Continued)

FOREIGN PATENT DOCUMENTS

EP    0 651 431    5/1995

(Continued)

OTHER PUBLICATIONS

Pending U.S. Appl. No. 10/020,961 including original specification.

(Continued)

*Primary Examiner*—Fernando L. Toledo
(74) *Attorney, Agent, or Firm*—Cook, Alex, McFarron, Manzo, Cummings & Mehler, Ltd.

(57) ABSTRACT

The present invention is characterized in that a semiconductor film containing a rare gas element is formed on a crystalline semiconductor film obtained by using a catalytic element via a barrier layer, and the catalytic element is moved from the crystalline semiconductor film to the semiconductor film containing a rare gas element by a heat treatment. Furthermore, a first impurity region and a second impurity region formed in a semiconductor layer of a first n-channel TFT are provided outside a gate electrode. A third impurity region formed in a semiconductor layer of a second n-channel TFT is provided so as to be partially overlapped with a gate electrode. A third impurity region is provided outside a gate electrode. A fourth impurity region formed in a semiconductor layer of a p-channel TFT is provided so as to be partially overlapped with a gate electrode. A fifth impurity region is provided outside a gate electrode.

11 Claims, 19 Drawing Sheets

U.S. PATENT DOCUMENTS

| | | | |
|---|---|---|---|
| 4,371,403 A | 2/1983 | Ikubo et al. | 148/1.5 |
| 4,477,308 A | 10/1984 | Gibson et al. | 156/603 |
| 4,534,820 A | 8/1985 | Mori et al. | 156/603 |
| 4,727,044 A | 2/1988 | Yamazaki | 438/166 |
| 5,244,819 A | 9/1993 | Yue | 437/11 |
| 5,248,630 A | 9/1993 | Serikawa et al. | 438/166 |
| 5,275,896 A | 1/1994 | Garofalo et al. | 430/5 |
| 5,403,772 A | 4/1995 | Zhang et al. | 437/101 |
| 5,426,064 A | 6/1995 | Zhang et al. | 437/40 |
| 5,481,121 A | 1/1996 | Zhang et al. | 257/364 |
| 5,488,000 A | 1/1996 | Zhang et al. | 437/21 |
| 5,492,843 A | 2/1996 | Adachi et al. | 437/21 |
| 5,501,989 A | 3/1996 | Takayama et al. | 437/21 |
| 5,508,533 A | 4/1996 | Takemura | 257/64 |
| 5,529,937 A | 6/1996 | Zhang et al. | 437/10 |
| 5,534,716 A | 7/1996 | Takemura | 257/72 |
| 5,543,352 A | 8/1996 | Ohtani et al. | 437/101 |
| 5,550,070 A | 8/1996 | Funai et al. | 437/41 |
| 5,551,984 A | 9/1996 | Tanahashi | 118/724 |
| 5,563,426 A | 10/1996 | Zhang et al. | 257/66 |
| 5,569,610 A | 10/1996 | Zhang et al. | 437/21 |
| 5,569,936 A | 10/1996 | Zhang et al. | 257/66 |
| 5,580,792 A | 12/1996 | Zhang et al. | 437/10 |
| 5,585,291 A | 12/1996 | Ohtani et al. | 437/40 |
| 5,589,694 A | 12/1996 | Takayama et al. | 257/67 |
| 5,595,923 A | 1/1997 | Zhang et al. | 437/41 |
| 5,595,944 A | 1/1997 | Zhang et al. | 437/41 |
| 5,604,360 A | 2/1997 | Zhang et al. | 257/72 |
| 5,605,846 A | 2/1997 | Ohtani et al. | 437/21 |
| 5,606,179 A | 2/1997 | Yamazaki et al. | 257/59 |
| 5,608,232 A | 3/1997 | Yamazaki et al. | 257/66 |
| 5,612,250 A | 3/1997 | Ohtani et al. | 437/101 |
| 5,614,426 A | 3/1997 | Funada et al. | 437/40 |
| 5,614,733 A | 3/1997 | Zhang et al. | 257/66 |
| 5,616,506 A | 4/1997 | Takemura et al. | 438/150 |
| 5,620,910 A | 4/1997 | Teramoto | 438/151 |
| 5,621,224 A | 4/1997 | Yamazaki et al. | 257/66 |
| 5,624,851 A | 4/1997 | Takayama et al. | 438/166 |
| 5,637,515 A | 6/1997 | Takemura | 438/162 |
| 5,639,698 A | 6/1997 | Yamazaki et al. | 437/228 |
| 5,643,826 A | 7/1997 | Ohtani et al. | |
| 5,646,424 A | 7/1997 | Zhang et al. | 257/66 |
| 5,654,203 A | 8/1997 | Ohtani et al. | 438/97 |
| 5,656,825 A | 8/1997 | Kusumoto et al. | 257/66 |
| 5,663,077 A | 9/1997 | Adachi et al. | 438/151 |
| 5,677,549 A | 10/1997 | Takayama et al. | 257/66 |
| 5,696,003 A | 12/1997 | Makita et al. | 437/21 |
| 5,696,386 A | 12/1997 | Yamazaki | 257/57 |
| 5,696,388 A | 12/1997 | Funada et al. | 257/64 |
| 5,700,333 A | 12/1997 | Yamazaki et al. | 136/258 |
| 5,705,829 A | 1/1998 | Miyanaga et al. | 257/66 |
| 5,712,191 A | 1/1998 | Nakajima et al. | 437/174 |
| 5,744,824 A | 4/1998 | Kousai et al. | 257/74 |
| 5,773,327 A | 6/1998 | Yamazaki et al. | 438/154 |
| 5,789,284 A | 8/1998 | Yamazaki et al. | 438/166 |
| 5,814,540 A | 9/1998 | Takemura et al. | 438/166 |
| 5,843,225 A | 12/1998 | Takayama et al. | 117/8 |
| 5,851,860 A | 12/1998 | Makita et al. | 438/166 |
| 5,869,363 A | 2/1999 | Yamazaki et al. | 438/166 |
| 5,888,858 A | 3/1999 | Yamazaki et al. | 438/162 |
| 5,893,730 A | 4/1999 | Yamazaki et al. | 438/166 |
| 5,897,347 A | 4/1999 | Yamazaki et al. | 438/166 |
| 5,915,174 A | 6/1999 | Yamazaki et al. | 438/166 |
| 5,923,962 A | 7/1999 | Ohtani et al. | |
| 5,932,893 A | 8/1999 | Miyanaga et al. | 257/66 |
| 5,949,115 A | 9/1999 | Yamazaki et al. | 257/396 |
| 5,956,579 A | 9/1999 | Yamazaki et al. | 438/151 |
| 5,960,252 A | 9/1999 | Matsuki et al. | 438/3 |
| 5,961,743 A | 10/1999 | Yamazaki et al. | 136/258 |
| 5,970,327 A | 10/1999 | Makita et al. | 438/166 |
| 5,977,559 A | 11/1999 | Zhang et al. | 257/57 |
| 5,985,740 A | 11/1999 | Yamazaki et al. | 438/486 |
| 5,997,286 A | 12/1999 | Hemsath et al. | 432/59 |
| 5,998,838 A | 12/1999 | Tanabe et al. | 257/347 |
| 6,013,544 A | 1/2000 | Makita et al. | 438/166 |
| 6,015,593 A | 1/2000 | Yonkoski et al. | 427/379 |
| 6,022,458 A | 2/2000 | Ichikawa | 204/192.23 |
| 6,027,987 A | 2/2000 | Yamazaki et al. | 438/486 |
| 6,048,758 A | 4/2000 | Yamazaki et al. | 438/166 |
| 6,063,654 A | 5/2000 | Ohtani | 438/166 |
| 6,066,518 A | 5/2000 | Yamazaki | 438/166 |
| 6,071,764 A | 6/2000 | Zhang et al. | 438/166 |
| 6,071,766 A | 6/2000 | Yamazaki et al. | 438/166 |
| 6,072,193 A | 6/2000 | Ohnuma et al. | 257/57 |
| 6,077,731 A | 6/2000 | Yamazaki et al. | 438/150 |
| 6,077,758 A | 6/2000 | Zhang et al. | 438/486 |
| 6,083,324 A | 7/2000 | Henley et al. | 148/33.2 |
| 6,084,247 A | 7/2000 | Yamazaki et al. | 257/88 |
| 6,087,679 A | 7/2000 | Yamazaki et al. | 257/65 |
| 6,093,934 A | 7/2000 | Yamazaki et al. | 257/51 |
| 6,100,562 A | 8/2000 | Yamazaki et al. | 257/347 |
| 6,111,557 A | 8/2000 | Koyama et al. | 345/89 |
| 6,121,660 A | 9/2000 | Yamazaki et al. | 257/348 |
| 6,133,073 A | 10/2000 | Yamazaki et al. | 438/151 |
| 6,133,075 A | 10/2000 | Yamazaki et al. | 438/158 |
| 6,133,119 A | 10/2000 | Yamazaki | 438/476 |
| 6,153,445 A | 11/2000 | Yamazaki et al. | 438/30 |
| 6,156,590 A | 12/2000 | Yamazaki et al. | 438/166 |
| 6,156,628 A | 12/2000 | Ohnuma et al. | 438/486 |
| 6,160,268 A | 12/2000 | Yamazaki | 257/57 |
| 6,162,667 A | 12/2000 | Funai et al. | 438/166 |
| 6,162,704 A | 12/2000 | Yamazaki et al. | 438/471 |
| 6,165,824 A | 12/2000 | Takano et al. | |
| 6,168,980 B1 | 1/2001 | Yamazaki et al. | 438/162 |
| 6,168,981 B1 | 1/2001 | Battaglia et al. | 438/164 |
| 6,180,439 B1 | 1/2001 | Yamazaki et al. | 438/162 |
| 6,184,559 B1 | 2/2001 | Hayakawa et al. | 257/401 |
| 6,194,255 B1 | 2/2001 | Hiroki et al. | 438/166 |
| 6,197,624 B1 | 3/2001 | Yamazaki | 438/158 |
| 6,201,585 B1 | 3/2001 | Takano et al. | 349/42 |
| 6,204,101 B1 | 3/2001 | Yamazaki et al. | 438/166 |
| 6,204,154 B1 | 3/2001 | Zhang et al. | 438/486 |
| 6,207,969 B1 | 3/2001 | Yamazaki | 257/49 |
| 6,218,219 B1 | 4/2001 | Yamazaki et al. | 438/149 |
| 6,225,152 B1 | 5/2001 | Yamazaki et al. | 438/162 |
| 6,232,205 B1 | 5/2001 | Ohtani | 438/476 |
| 6,232,621 B1 | 5/2001 | Yamazaki et al. | 257/66 |
| 6,242,290 B1 | 6/2001 | Nakajima et al. | 438/153 |
| 6,251,712 B1 | 6/2001 | Tanaka et al. | 438/143 |
| 6,255,195 B1 | 7/2001 | Linn et al. | 438/455 |
| 6,285,042 B1 | 9/2001 | Ohtani et al. | |
| 6,287,900 B1 | 9/2001 | Yamazaki et al. | 438/151 |
| 6,287,988 B1 | 9/2001 | Nagamine et al. | 438/770 |
| 6,291,275 B1 | 9/2001 | Yamazaki et al. | 438/151 |
| 6,294,441 B1 | 9/2001 | Yamazaki | 438/486 |
| 6,300,659 B1 | 10/2001 | Zhang et al. | 257/347 |
| 6,303,415 B1 | 10/2001 | Yamazaki et al. | 438/166 |
| 6,303,963 B1 | 10/2001 | Ohtani et al. | 257/350 |
| 6,306,694 B1 | 10/2001 | Yamazaki et al. | 438/151 |
| 6,307,214 B1 | 10/2001 | Ohtani et al. | 257/59 |
| 6,316,789 B1 | 11/2001 | Yamazaki et al. | 257/66 |
| 6,316,810 B1 | 11/2001 | Yamazaki et al. | 257/347 |
| 6,331,457 B1 | 12/2001 | Yamazaki et al. | 438/166 |
| 6,337,259 B1 | 1/2002 | Ueda et al. | 438/471 |
| 6,346,730 B1 | 2/2002 | Kitakado et al. | 257/350 |
| 6,362,507 B1 | 3/2002 | Ogawa et al. | 257/350 |
| 6,376,336 B1 | 4/2002 | Buynoski | 438/476 |
| 6,391,690 B2 | 5/2002 | Miyasaka | 438/149 |
| 6,396,147 B1 | 5/2002 | Adachi et al. | 257/758 |
| 6,399,454 B1 | 6/2002 | Yamazaki | 438/308 |
| 6,399,988 B1 | 6/2002 | Yamazaki | 257/344 |
| 6,420,758 B1 | 7/2002 | Nakajima | 257/350 |
| 6,426,276 B1 | 7/2002 | Ohnuma et al. | 438/476 |
| 6,429,097 B1 | 8/2002 | Voutsas et al. | 438/478 |

| | | | |
|---|---|---|---|
| 6,436,745 B1 | 8/2002 | Gotou et al. | 438/166 |
| 6,461,943 B1 | 10/2002 | Yamazaki et al. | 438/471 |
| 6,489,189 B2 | 12/2002 | Yamazaki et al. | 438/166 |
| 6,512,504 B1 | 1/2003 | Yamauchi et al. | 345/87 |
| 6,515,336 B1* | 2/2003 | Suzawa et al. | 257/350 |
| 6,531,713 B1 | 3/2003 | Yamazaki | 257/59 |
| 6,534,826 B2 | 3/2003 | Yamazaki | 257/336 |
| 6,541,294 B1 | 4/2003 | Yamazaki et al. | 438/29 |
| 6,576,926 B1 | 6/2003 | Yamazaki et al. | 257/66 |
| 6,579,736 B2 | 6/2003 | Yamazaki | 438/22 |
| 6,670,259 B1 | 12/2003 | Chan | 438/473 |
| 6,680,577 B1 | 1/2004 | Inukai et al. | 315/169.3 |
| 6,709,902 B2 | 3/2004 | Kitakado et al. | 438/149 |
| 6,737,304 B2 | 5/2004 | Yamazaki et al. | 438/151 |
| 6,743,649 B2 | 6/2004 | Yamazaki et al. | 438/29 |
| 6,808,968 B2 | 10/2004 | Yamazaki et al. | 438/166 |
| 2001/0025958 A1* | 10/2001 | Yamazaki et al. | 257/72 |
| 2001/0034088 A1 | 10/2001 | Nakamura et al. | 438/166 |
| 2001/0034089 A1* | 10/2001 | Yamazaki et al. | 438/166 |
| 2002/0028543 A1 | 3/2002 | Yamazaki et al. | 438/154 |
| 2002/0086469 A1 | 7/2002 | Kim et al. | 438/166 |
| 2002/0102764 A1 | 8/2002 | Yamazaki et al. | 438/69 |
| 2002/0106861 A1 | 8/2002 | Yamazaki | 438/308 |
| 2002/0125480 A1 | 9/2002 | Nakamura et al. | 257/66 |
| 2002/0134981 A1 | 9/2002 | Nakamura et al. | 257/62 |
| 2002/0139980 A1* | 10/2002 | Yamazaki | 257/72 |
| 2002/0142254 A1 | 10/2002 | Nakajima | 438/301 |
| 2002/0151120 A1 | 10/2002 | Yamazaki et al. | 438/166 |
| 2002/0151154 A1 | 10/2002 | Yamazaki et al. | 438/502 |
| 2002/0163035 A1* | 11/2002 | Yamazaki | 257/336 |
| 2002/0164843 A1 | 11/2002 | Yamazaki et al. | 438/166 |
| 2002/0187594 A1 | 12/2002 | Yamazaki et al. | 438/166 |
| 2002/0197785 A1 | 12/2002 | Yamazaki et al. | 438/225 |
| 2003/0060057 A1 | 3/2003 | Raaijmakers et al. | 438/770 |
| 2003/0062499 A1 | 4/2003 | Yamazaki | 251/200 |
| 2003/0122129 A1 | 7/2003 | Yamazaki et al. | 257/64 |
| 2003/0132900 A1 | 7/2003 | Yamauchi et al. | 345/76 |
| 2003/0197179 A1 | 10/2003 | Yamazaki et al. | 257/59 |
| 2004/0065902 A1 | 4/2004 | Yamazaki et al. | 257/200 |
| 2005/0032336 A1 | 2/2005 | Yamazaki et al. | 438/476 |

FOREIGN PATENT DOCUMENTS

| | | |
|---|---|---|
| EP | 1 031 873 A2 | 8/2000 |
| JP | 5-109737 | 4/1993 |
| JP | 06-151414 | 5/1994 |
| JP | 7-130652 | 5/1995 |
| JP | 7-183540 | 7/1995 |
| JP | 8-078329 | 3/1996 |
| JP | 9-074207 | 3/1997 |
| JP | 10-055951 | 2/1998 |
| JP | 3032801 | 9/1998 |
| JP | 2000-105081 | 4/2000 |
| JP | 2000-260777 | 9/2000 |
| JP | 2001-007343 | 1/2001 |
| JP | 2001-210828 | 8/2001 |
| JP | 2001-267264 | 9/2001 |

OTHER PUBLICATIONS

Pending U.S. Appl. No. 10/056,055 to Nakamura et al filed Jan. 28, 2002, including original specification and PTO filing receipt.

Pending U.S. Appl. No. 10/066,542 to Nakamura et al filed Feb. 5, 2002, including original specification and PTO filing receipt.

Pending U.S. Appl. No. 10/074,050 to Yamazaki et al filed Feb. 14, 2002, including original specification and PTO filing receipt.

Pending U.S. Appl. No. 10/072,931 to Yamazaki et al filed Feb. 12, 2002, including original specification and PTO filing receipt.

Pending U.S. Appl. No. 10/097,641 to Yamazaki et al filed Mar. 15, 2002, including original specification and PTO filing receipt.

Miyake, M. et al, "Characteristics of Buried-Channel pMOS Devices with Shallow Counter-Doped Layers Fabricated Using Channel Preamorphization," IEEE Transactions on Electron Devices, vol. 43, No. 3, pp. 444-449, Mar. 1996.

Lee, L.S. et al, 'Argon Ion-Implantation on Polysilicon or Amorphous-Silicon for Boron Penetration Suppression in p+ pMOSFET,' IEEE Transactions on Electron Devices, vol. 45, No. 8, pp. 1737-1744, Aug. 1998.

Llewellyn, D.J. et al, "Implantation and Annealing of Cu in InP for Electrical Isolation: Microstructural Characterisation," pp. 313-316, IEEE (1997).

Jones, K.S. et al, "Boron Diffusion Upon Annealing of Laser Thermal Processed Silicon," pp. 111-114, IEEE (2000).

* cited by examiner

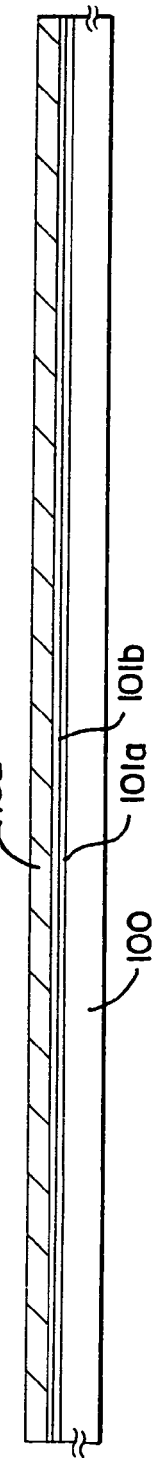
FIG. 1A FORMATION OF AMORPHOUS SEMICONDUCTOR FILM
FIG. 1B FORMATION OF CATALYTIC ELEMENT CONTAINING LAYER
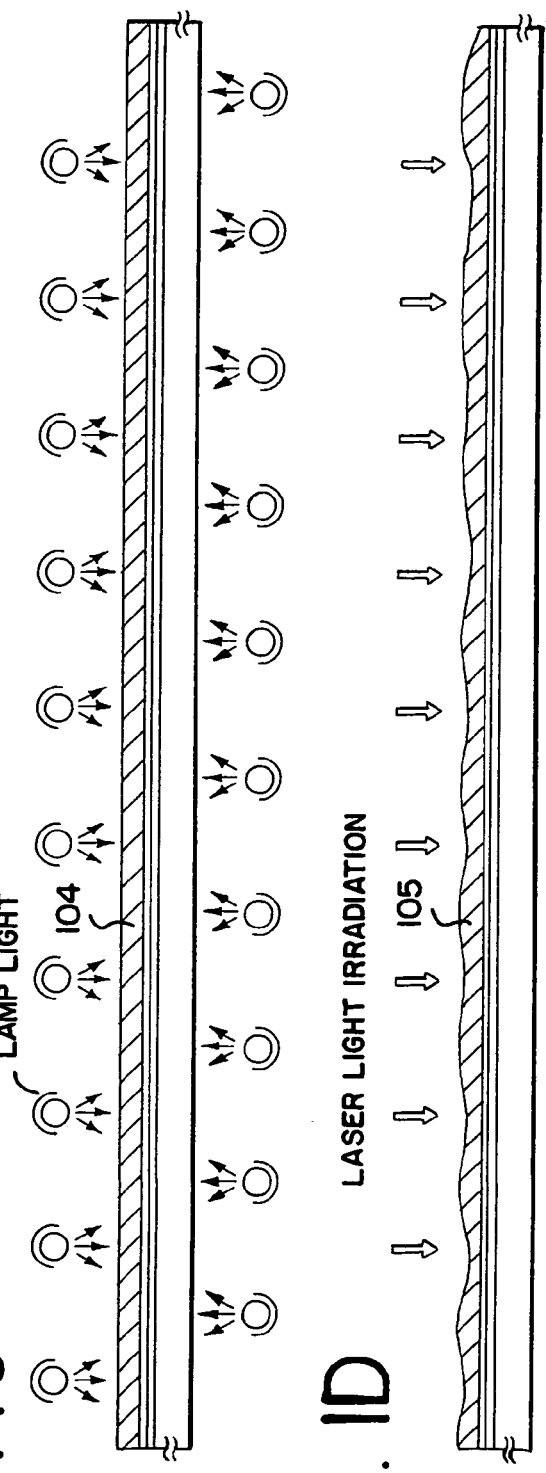
FIG. 1C HEAT TREATMENT (CRYSTALLIZATION OF SEMICONDUCTOR FILM) LAMP LIGHT
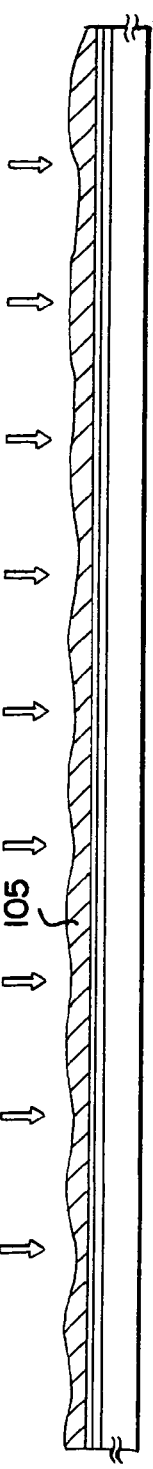
FIG. 1D LASER LIGHT IRRADIATION

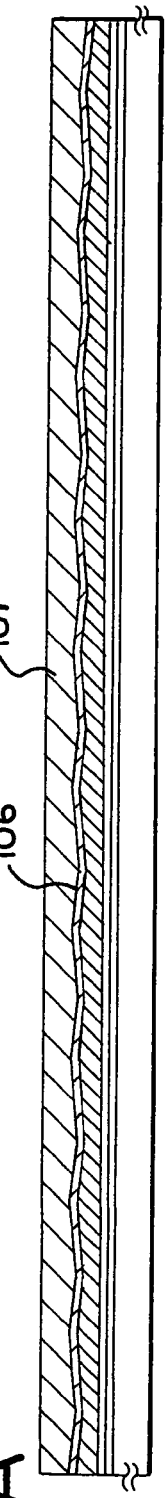
FIG. 2A FORMATION OF BARRIER LAYER AND SEMICONDUCTOR FILM CONTAINING RARE GAS ELEMENT
106, 107
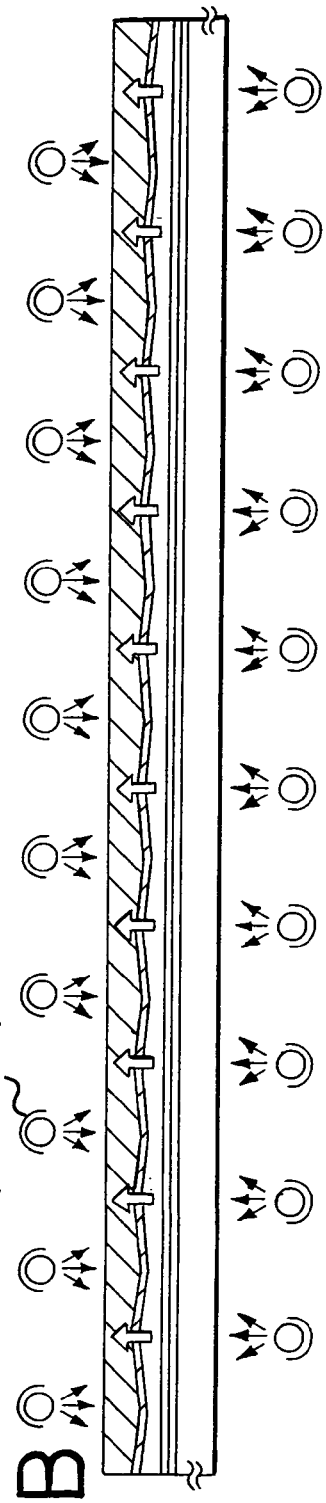
FIG. 2B HEAT TREATMENT (GETTERING)
108
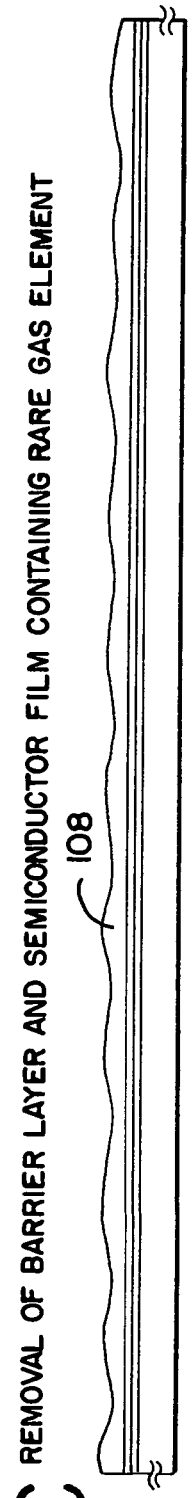
FIG. 2C REMOVAL OF BARRIER LAYER AND SEMICONDUCTOR FILM CONTAINING RARE GAS ELEMENT
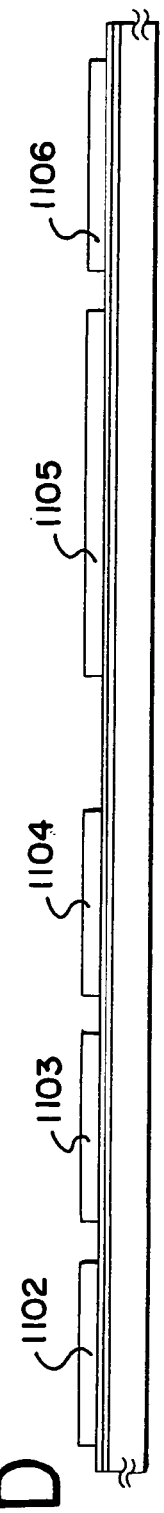
FIG. 2D FORMATION OF ACTIVE LAYER
1102, 1103, 1104, 1105, 1106

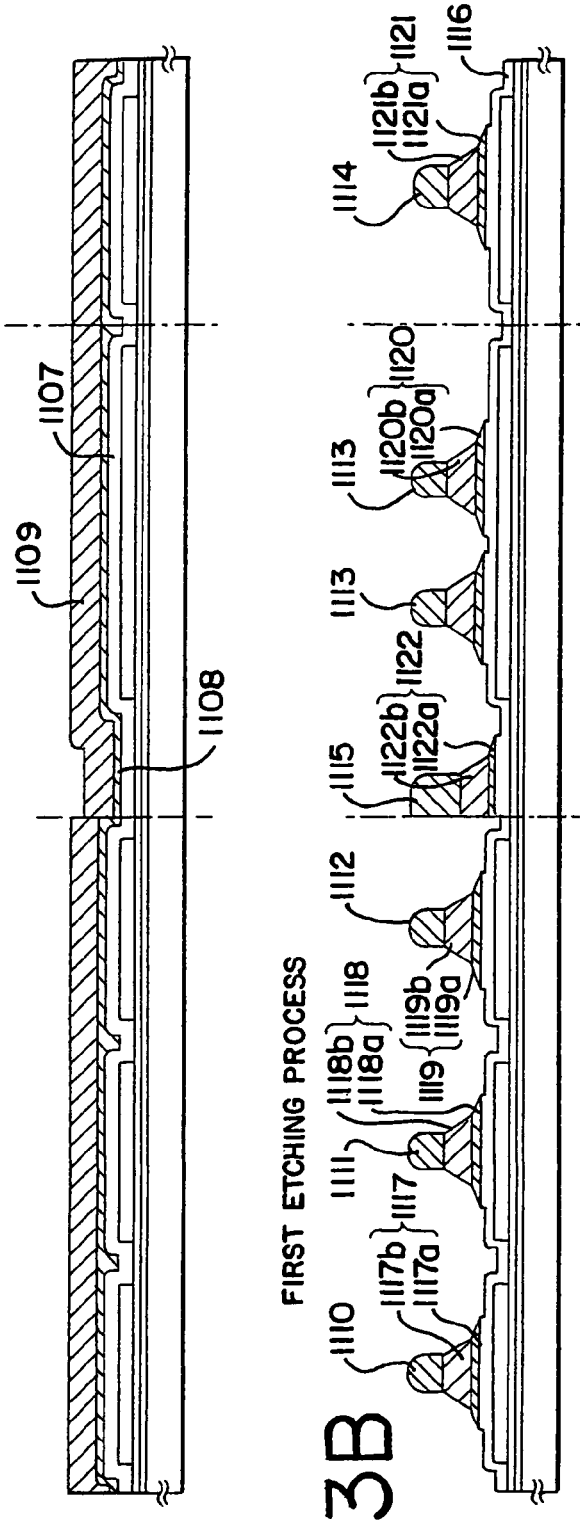

FORMATION OF INTERPLAYER INSULATING FILM
FORMATION OF PIXEL ELECTRODE AND WIRING

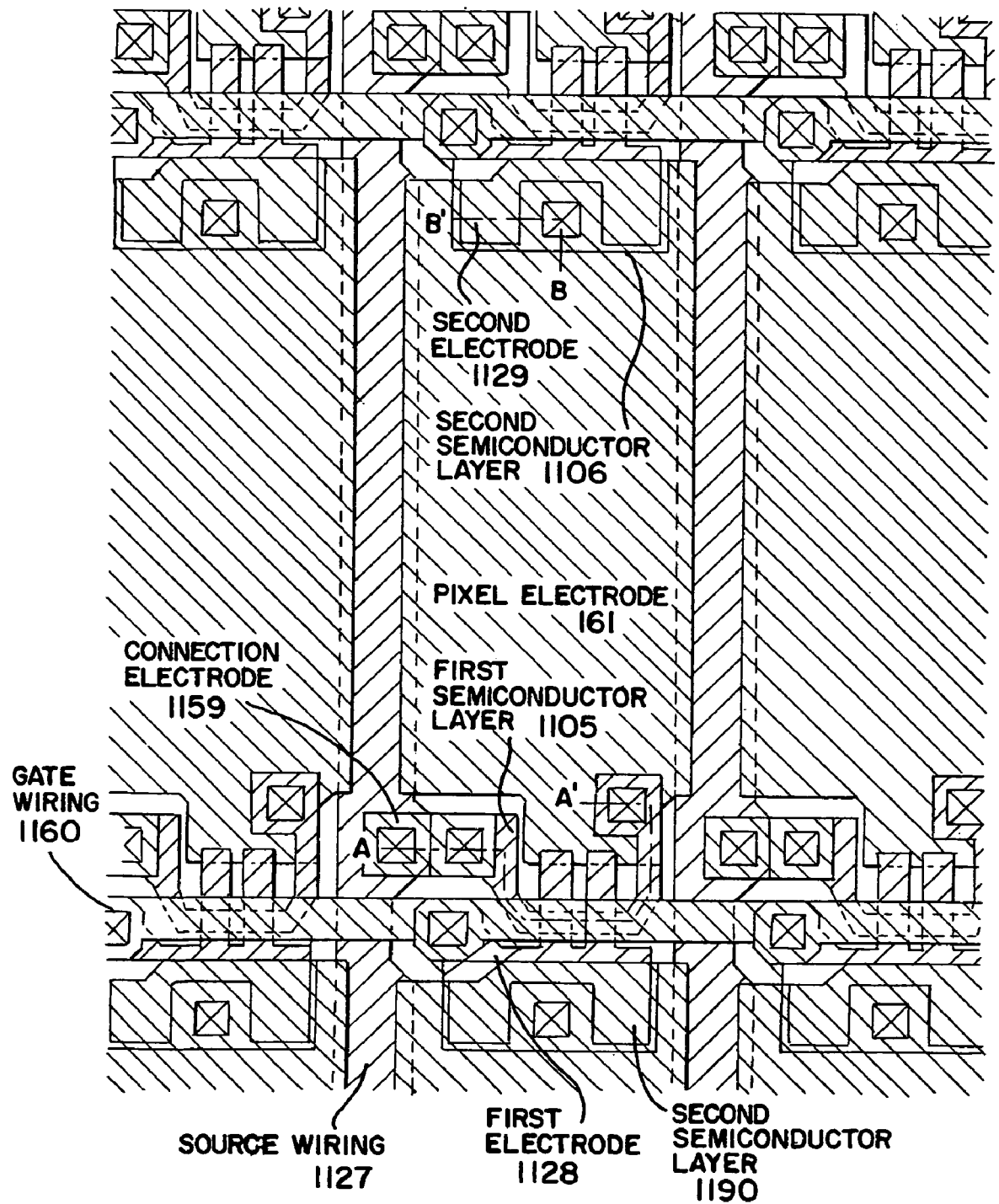

PROJECTION APPARATUS
(THREE PLATES TYPE)

LIGHT SOURCE
OPTICAL SYSTEM

FORMATION OF GATE WIRING

FORMATION OF GATE
INSULATING FILM
AND SEMICONDUCTOR FILM

CRYSTALLIZATION

GETTERING

ADDITION OF IMPURITY ELEMENT

ACTIVATION

FORMATION OF INTERLAYER INSULATING FILM

FORMATION OF SOURCE WIRING AND DRAIN WIRING

FIG. 17A
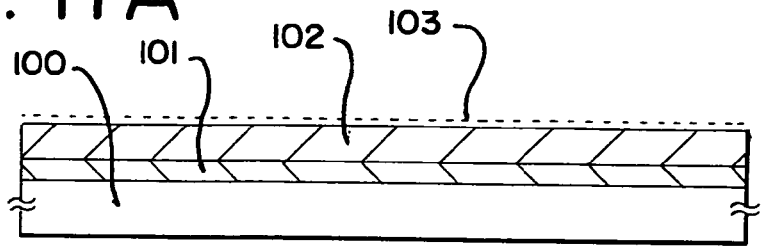
FIG. 17B HEAT TREATMENT
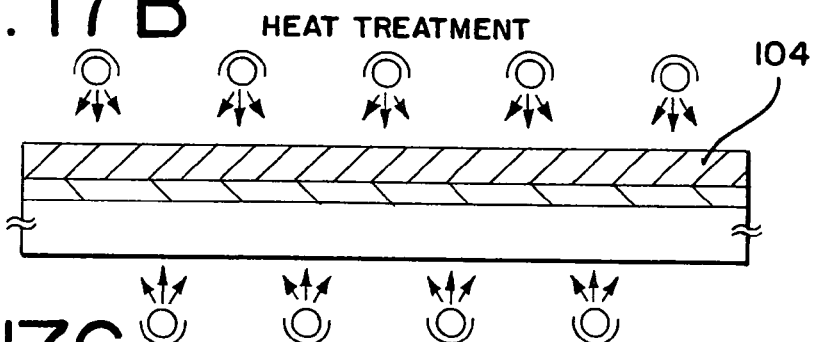
FIG. 17C
ADDITION OF RARE GAS
SEMICONDUCTOR FILM CONTAINING RARE GAS ELEMENT
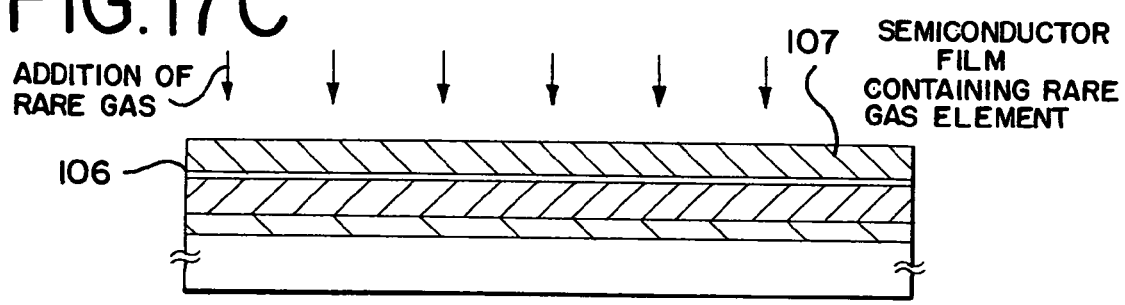
FIG. 17D HEAT TREATMENT
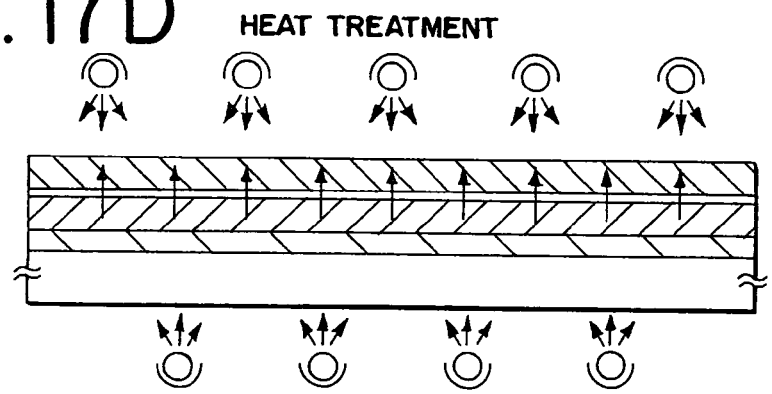
FIG. 17E
LASER LIGHT
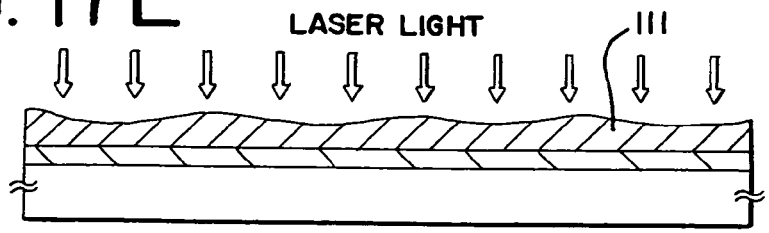

ESTIMATED GUARANTEED VOLTAGE (ON CURRENT 10% DEGRADATION) DEPENDENCE ON LENGTH OF LOV (L/W=10/8 μm)

STATIC CHARACTERISTIC OF PIXEL TFT (L/W = 4.5 x 2/3 μm)

METHOD OF MANUFACTURING A SEMICONDUCTOR DEVICE COMPRISING DOPING STEPS USING GATE ELECTRODES AND RESISTS AS MASKS

This is a continuation of application Ser. No. 10/051,064 filed Jan. 18, 2002 now U.S. Pat. No. 6,913,956.

BACKGROUND OF THE INVENTION

1. Field of the Invention

The present invention relates to a semiconductor device using a thin film transistor (hereinafter, referred to as a "TFT") utilizing a semiconductor film (hereinafter, referred to as a "crystalline semiconductor film") having a crystalline structure formed on a substrate and a method of manufacturing the same. In the present specification, a semiconductor device generally refers to devices that function using semi conductor characteristics. A semiconductor device manufactured according to the present invention includes a liquid crystal display device and the like having a semiconductor integrated circuit (microprocessor, signal processing circuit, high-frequency circuit, or the like) constituted by using a TFT.

2. Description of the Related Art

A liquid crystal display device having a driving circuit and a pixel portion formed on the same substrate by using a TFT is being actively manufactured. A semiconductor film is used as an active layer of a TFT, and in particular, a crystalline silicon film is used as an active layer, whereby a high field-field mobility has been realized. This technique enables a monolithic liquid crystal display device to be obtained, in which a pixel TFT constituting a pixel portion and a TFT for a driving circuit provided in the periphery of the pixel portion are formed on one glass substrate.

The electrical characteristics of a TFT depend upon the quality of a semiconductor film. In particular, a field-effect mobility depends upon the crystallinity of a semiconductor film, and directly influences response characteristics of a TFT and a display ability of a liquid crystal display device manufactured by using a TFT for a circuit.

Therefore, a method of forming a crystalline semiconductor film of good quality is being actively studied. For example, a method of forming an amorphous semiconductor film, and thereafter, crystallizing the amorphous semiconductor film by irradiation with laser light, a method of crystallizing an amorphous semiconductor film by heat treatment using an electrothermal furnace, and the like are employed. However, a semiconductor film manufactured by such a method is composed of a number of crystal grains, and its crystal orientation cannot be controlled due to its alignment in an arbitrary direction. Therefore, compared with a semiconductor of single crystal, carriers do not move smoothly, which restricts electrical characteristics of a TFT.

In contrast, Japanese Patent Application Laid-open No. Hei 7-183540 discloses a technique of crystallizing a silicon semiconductor film by adding a metal element such as nickel. Such a metal element is known to function as a catalyst to promote crystallization and lower the temperature required therefor. Such a metal element can also enhance the alignment of a crystal orientation. It is known that one kind or a plurality of kinds selected from Fe, Ni, Co, Ru, Rh, Pd, Os, Ir, Pt, Cu, and Au can be used as an element having a catalytic function.

However, there is a problem in that if a metal element having a catalytic function (herein, all the metal elements having a catalytic function are called a catalytic element) is added, the metal element remains in or on a semiconductor film, which varies electrical characteristics of a TFT. For example, an off current of a TFT increases to vary the electrical characteristics among respective elements. More specifically, a metal element having a catalytic function with respect to crystallization becomes unnecessary, once a crystalline semiconductor film is formed.

The inventors of the present invention disclose a method of removing a metal element added for crystallization from a particular region of a semiconductor film even at a heating temperature of about 500° C., by applying a gettering technique using phosphorus. For example, by conducting a heat treatment at 450° C. to 700° C. by adding phosphorus to a source/drain region of a TFT, a metal element added for crystallization can be easily removed from a device formation region. Japanese Patent No. 3032801 discloses an example of such a technique.

Furthermore, by using a semiconductor film of good quality having a high crystal orientation as described above, an active matrix type liquid crystal display device has been developed in which a driving circuit and a pixel portion are integrally formed on the same substrate.

A driving circuit of an active matrix type liquid crystal display device requires preventing deterioration due to a high driving ability (on-current, $I_{on}$) and hot carrier effects, whereas a pixel portion requires a low off-current ($I_{off}$).

As a TFT structure for reducing an off current, a lightly doped drain (LDD) structure is known. In this structure, an LDD region with an impurity element added thereto in a low concentration is provided between a channel formation region and a source region or a drain region formed by adding an impurity element in a high concentration. As a structure effective for preventing deterioration of an on-current value due to hot carriers, an LDD structure in which an LDD region partially overlaps a gate electrode, i.e., a gate-drain overlapped LDD (hereinafter, referred to as a "GOLD") structure is known.

The inventors of the present invention disclose a method of gettering a catalytic element from a semiconductor film after conducting a low-temperature crystallization process using a catalytic element as described above. For example, there are a method of forming a gettering site doped with an element (typically, phosphorus) belonging to Group 15 of the periodic table having a gettering function in a high concentration, moving a catalytic element to the gettering region by a heat treatment, and removing the gettering site, a method of gettering (moving) a catalytic element in a semiconductor layer to a source region or a drain region in the same heat treatment process as that of activation of phosphorus added to a region to be the source region or the drain region, and the like. The above-mentioned gettering enables a metal element introduced into a semiconductor film for crystallization to be removed by conducting a heat treatment at 550° C. for about 4 hours.

However, the concentration of phosphorus added to a semiconductor film for obtaining a gettering function is $1 \times 10^{20}/cm^3$ or more, preferably $1 \times 10^{21}/cm^3$. Thus, it takes a long time for doping the semiconductor film with phosphorus.

Furthermore, addition of phosphorus in a high concentration by ion implantation or ion doping (in the present specification, which refers to a method in which mass separation of ions to be implanted is not conducted) makes it difficult for a semiconductor film to be recrystallized.

Furthermore, in an active matrix type liquid crystal display device in which a driving circuit is integrally formed, performance required for a driving circuit is different from that required for a pixel portion. Therefore, if it is attempted to optimize the structure of a TFT in accordance with the respective requirements, production processes become complicated, which necessarily increases the number of required photomasks. On the other hand, according to a procedure of forming a region containing an impurity element, such as an LDD region in a self-alignment manner by using a gate electrode, a processing precision is inescapably worsened along the enlargement in a substrate size.

SUMMARY OF THE INVENTION

Therefore, with the foregoing in mind, it is an object of the present invention to provide a technique of effectively removing a catalytic element (metal element) from a crystalline semiconductor film obtained by the catalytic element without increasing the number of processes.

It is another object of the present invention to provide a technique of realizing a structure of a TFT optimum for driving conditions for a pixel portion and a driving circuit using a small number of photomasks.

The present invention relates to a semiconductor device including a first n-channel TFT, a second n-channel TFT, and a p-channel TFT on the same substrate, characterized in that: a first impurity region and a second impurity region formed in a semiconductor layer of the first n-channel TFT are provided outside a gate electrode; a third impurity region formed in a semiconductor layer of the second n-channel TFT is provided so as to be partially overlapped with a gate electrode, and the third impurity region is provided outside the gate electrode; and a fourth impurity region formed in a semiconductor layer of the p-channel TFT is provided so as to be partially overlapped with a gate electrode, and a fifth impurity region is provided outside a gate electrode.

Further, the present invention relates to a semiconductor device including a first n-channel TFT, a second n-channel TFT, and a p-channel TFT on the same substrate, characterized in that: a first impurity region that is formed in a semiconductor layer of the first n-channel TFT and is to be an LDD region and a second impurity region to be a source/drain region are provided outside a gate electrode; a third impurity region that is formed in a semiconductor layer of the second n-channel TFT and is to be an LDD region is provided so as to be partially overlapped with a gate electrode, and the third impurity region to be a source/drain region is provided outside the gate electrode; and a fourth impurity region that is formed in a semiconductor layer of the p-channel TFT and is to be an LDD region is provided so as to be partially overlapped with a gate electrode, and a fifth impurity region to be a source/drain region is provided outside a gate electrode.

Further, the present invention relates to a semiconductor device including a first n-channel TFT provided in a pixel portion, and a second n-channel TFT and a p-channel TFT provided in a driving circuit on the same substrate, characterized in that: a first impurity region and a second impurity region formed in a semiconductor layer of the first n-channel TFT are provided outside a gate electrode; a third impurity region formed in a semiconductor layer of the second n-channel TFT is provided so as to be partially overlapped with a gate electrode, and the third impurity region is provided outside the gate electrode; and a fourth impurity region formed in a semiconductor layer of the p-channel TFT is provided so as to be partially overlapped with a gate electrode, and a fifth impurity region is provided outside a gate electrode.

Further, the present invention relates to a semiconductor device including a first n-channel TFT provided in a pixel portion, and a second n-channel TFT and a p-channel TFT provided in a driving circuit on the same substrate, characterized in that: a first impurity region that is formed in a semiconductor layer of the first n-channel TFT and is to be an LDD region and a second impurity region to be a source/drain region is provided outside a gate electrode; a third impurity region that is formed in a semiconductor layer of the second n-channel TFT and is to be an LDD region is provided so as to be partially overlapped with a gate electrode, and the third impurity region to be a source/drain region is provided outside the gate electrode; and a fourth impurity region that is formed in a semiconductor layer of the p-channel TFT and is to be an LDD region is provided so as to be partially overlapped with a gate electrode, and a fifth impurity region to be a source/drain region is provided outside a gate electrode.

Further, in the invention described above, a semiconductor device is characterized in that the second n-channel TFT is provided in a buffer circuit.

Further, the present invention relates to a method of manufacturing a semiconductor device, characterized by comprising the steps of:

forming an amorphous semiconductor film containing silicon as a main component on an insulating surface;

adding a catalytic element for promoting crystallization to the amorphous semiconductor film, followed by conducting a first heat treatment, thereby forming a crystalline semiconductor film;

forming a barrier layer on the crystalline semiconductor film;

forming a semiconductor film containing a rare gas element in a concentration of $1\times10^{19}/cm^3$ to $1\times10^{22}/cm^3$ on the barrier layer;

moving the catalytic element to the semiconductor film containing the rare gas element by a second heat treatment; and removing the semiconductor film containing the rare gas element.

Further, the present invention relates to a method of manufacturing a semiconductor device, characterized by comprising the steps of:

forming an amorphous semiconductor film containing silicon as a main component on an insulating surface;

adding a catalytic element for promoting crystallization to the amorphous semiconductor film to form a crystalline semiconductor film by a first heat treatment;

irradiating the crystalline semiconductor film with laser light;

forming a barrier layer on the crystalline semiconductor film;

forming a semiconductor film containing a rare gas element in a concentration of $1\times10^{19}/cm^3$ to $1\times10^{22}/cm^3$ on the barrier layer;

moving the catalytic element to the semiconductor film containing the rare gas element by a second heat treatment; and removing the semiconductor film containing the rare gas element.

Further, the present invention relates to a method of manufacturing a semiconductor device, characterized by comprising the steps of:

forming an amorphous semiconductor film containing silicon as a main component on an insulating surface;

adding a catalytic element for promoting crystallization to the amorphous semiconductor film to form a crystalline semiconductor film by a first heat treatment;

forming a barrier layer on the crystalline semiconductor film;

forming a semiconductor film containing a rare gas element in a concentration of $1\times10^{19}/cm^3$ to $1\times10^{22}/cm^3$ on the barrier layer;

moving the catalytic element to the semiconductor film by a second heat treatment;

removing the semiconductor film containing the rare gas element; and irradiating the crystalline semiconductor film with laser light.

Further, the present invention relates to a method of manufacturing a semiconductor device, characterized by comprising the steps of:

forming an amorphous semiconductor film containing silicon as a main component on an insulating surface;

adding a catalytic element for promoting crystallization to the amorphous semiconductor film;

forming a barrier layer on the amorphous semiconductor film;

forming a semiconductor film containing a rare gas element in a concentration of $1\times10^{19}/cm^3$ to $1\times10^{22}/cm^3$ on the barrier layer;

conducting a heat treatment to crystallize the amorphous semiconductor film into a crystalline semiconductor film and to move the catalytic element to the semiconductor film containing the rare gas element;

removing the semiconductor film containing the rare gas element; and irradiating the crystalline semiconductor film with laser light.

Further, the present invention relates to a method of manufacturing a semiconductor device, characterized by comprising the steps of:

adding a catalytic element for promoting crystallization to an insulating surface;

forming an amorphous semiconductor film containing silicon as a main component on the insulating surface;

forming a barrier layer on the amorphous semiconductor film;

forming a semiconductor film containing a rare gas element in a concentration of $1\times10^{19}/cm^3$ to $1\times10^{22}/cm^3$ on the amorphous semiconductor film;

conducting a heat treatment to crystallize the amorphous semiconductor film into a crystalline semiconductor film and to move the catalytic element to the semiconductor film containing the rare gas element;

removing the semiconductor film containing the rare gas element; and irradiating the crystalline semiconductor film with laser light.

Further, the present invention relates to a method of manufacturing a semiconductor device, characterized by comprising the steps of:

adding a catalytic element for promoting crystallization to an insulating surface;

forming an amorphous semiconductor film containing silicon as a main component on the insulating surface;

forming a barrier layer on the amorphous semiconductor film;

forming a semiconductor film containing a rare gas element in a concentration of $1\times10^{19}/cm^3$ to $1\times10^{22}/cm^3$ on the amorphous semiconductor film;

adding a rare gas element to the semiconductor film containing the rare gas element;

conducting a heat treatment to crystallize the amorphous semiconductor film into a crystalline semiconductor film and to move the catalytic element to the semiconductor film containing the rare gas element;

removing the semiconductor film containing the rare gas element; and irradiating the crystalline semiconductor film with laser light.

Further, in the invention described above, a method of manufacturing a semiconductor device is characterized in that the barrier layer is a chemical oxide film formed by ozone water.

Further, in the invention described above, a method of manufacturing a semiconductor device is characterized in that the barrier layer is formed by oxidizing a surface of the amorphous semiconductor film by a plasma treatment.

Further, in the invention described above, a method of manufacturing a semiconductor device is characterized in that the barrier layer is formed by irradiating UV-rays in an atmosphere containing oxygen to generate ozone, thereby oxidizing a surface of the amorphous semiconductor film.

Further, in the invention described above, a method of manufacturing a semiconductor device is characterized in that the barrier layer is a porous film formed with a film thickness of 1 to 10 nm.

Further, in the invention described above, a method of manufacturing a semiconductor device is characterized in that the rare gas element is one kind or a plurality of kinds of element selected from the group consisting of He, Ne, Ar, Kr, and Xe.

Further, in the invention described above, a method of manufacturing a semiconductor device is characterized in that the first heat treatment and the second heat treatment are conducted by radiation from one kind or a plurality of kinds of lamps selected from the group consisting of a halogen lamp, a metal halide lamp, a xenon arc lamp, a carbon arc lamp, a high-pressure sodium lamp, and a high-pressure mercury lamp.

Further, in the invention described above, a method of manufacturing a semiconductor device is characterized in that the first heat treatment is conducted by using an electrothermal furnace.

Further, in the invention described above, a method of manufacturing a semiconductor device is characterized in that the second heat treatment is conducted by using an electrothermal furnace.

Further, in the invention described above, a method of manufacturing a semiconductor device is characterized in that the catalytic element is one kind or a plurality of kinds of elements selected from the group consisting of Fe, Ni, Co, Ru, Rh, Pd, Os, Ir, Pt, Cu, and Au.

Further, the present invention relates to a method of manufacturing a semiconductor device, characterized by comprising:

a first step of forming a semiconductor layer on an insulating surface;

a second step of forming an insulating film on the semiconductor layer;

a third step of forming a first-shaped conductive layer on the insulating film;

a fourth step of forming a second-shaped conductive layer from the first-shaped conductive layer;

a fifth step of adding an impurity element of one conductivity to the semiconductor layer, using the second-shaped conductive layer as a mask, to form a first impurity region;

a sixth step of adding an impurity element of one conductivity to a selected region of the semiconductor layer, using the second-shaped conductive layer as a mask, to form second and third impurity regions; and a seventh step of adding an impurity element of conductivity opposite to the one conductivity to a selected region of the semiconductor layer, using the second-shaped conductive layer as a mask, to form fourth and fifth impurity regions.

Further, the present invention relates to a method of manufacturing a semiconductor device, characterized by comprising the steps of:

a first step of forming a semiconductor layer on an insulating surface;

a second step of forming an insulating film on the semiconductor layer;

a third step of forming a first-shaped conductive layer on the insulating film;, a fourth step of forming a second-shaped conductive layer from the first-shaped conductive layer;

a fifth step of adding an impurity element of one conductivity to the semiconductor layer in a first dose amount, using the second-shaped conductive layer as a mask, to form a first impurity region;

a sixth step of adding an impurity element of one conductivity to a selected region of the semiconductor layer in a second dose amount, using the second-shaped conductive layer as a mask, to form second and third impurity regions; and a seventh step of adding an impurity element of conductivity opposite to the one conductivity to a selected region of the semiconductor layer, using the second-shaped conductive layer as a mask, to form fourth and fifth impurity regions.

Further, in the invention described above, a method of manufacturing a semiconductor device is characterized in that the impurity of one conductivity comprises an impurity imparting an n-type.

These and other advantages of the present invention will become apparent to those skilled in the art upon reading and understanding the following detailed description with reference to the accompanying drawings.

BRIEF DESCRIPTION OF THE DRAWINGS

In the accompanying drawings:

FIGS. 1A to 1D illustrate an exemplary embodiment mode according to the present invention;

FIGS. 2A to 2D illustrate an exemplary embodiment mode according to the present invention;

FIGS. 3A to 3C show an embodiment of the present invention;

FIG. 6 illustrates an embodiment of the present invention;

FIGS. 17A to 17E illustrate an exemplary embodiment mode according to the present invention;

DESCRIPTION OF THE PREFERRED EMBODIMENTS

Embodiment Mode 1

Figure 4A:
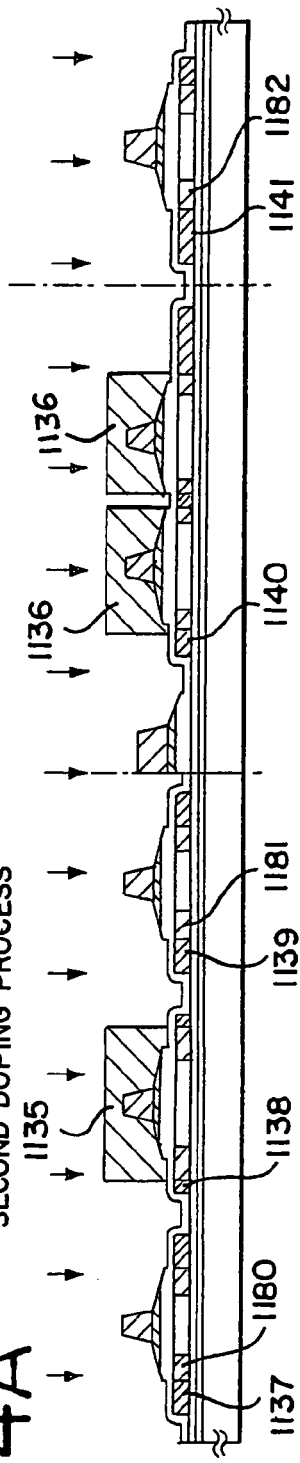
FIGS. 4A to 4C show an embodiment of the present invention.

A method of gettering will be described with reference to FIGS. 1A to 1D, in which a metal element having a catalytic function is added over the entire surface of an amorphous semiconductor film to crystallize the film, a semiconductor film containing a rare gas element (Ar in the present embodiment mode) is formed, and this film is used as a gettering site.

In FIG. 1A, there is no particular limit to the material of a substrate 100. However, barium borosilicate glass, aluminoborosilicate glass, quartz, or the like can be preferably used. On the surface of the substrate 100, an inorganic insulating film is formed into a thickness of 10 to 200 nm as a base insulating film 101. An example of a preferable base insulating film includes a silicon oxynitride film formed by plasma CVD. A first silicon oxynitride film 101a having a thickness of 50 nm made of $SiH_4$, $NH_3$, and $N_2O$ and a second silicon oxynitride film 101b having a thickness of 100 nm made of $SiH_4$ and $N_2O$ are used as the base insulating film 101. The base insulating film 101 is provided for the purpose of preventing alkali metal contained in a glass substrate from diffusing into a semiconductor film formed on the base insulating film 101. In the case of using quartz as a substrate, the base insulating film 101 may be omitted.

An amorphous semiconductor film 102 formed on the base insulating film 101 is made of a semiconductor material containing silicon as a main component. Typically, an amorphous silicon film, an amorphous silicon germanium film, or the like is formed into a thickness of 10 to 100 nm by plasma CVD, low-pressure CVD, or sputtering. In order to obtain a satisfactory crystal, the concentration of impurities such as oxygen and nitrogen contained in the amorphous semiconductor film 102 may be lowered to $5\times10^{18}/cm^3$ or less. These impurities hinder crystallization of an amorphous semiconductor, and increase the density of a trapping center and a recombination center even after crystallization. Therefore, it is desirable to use a CVD apparatus designed for ultra-high vacuum, which is subjected to mirror-surface treatment (electrical field grinding treatment) in a reaction chamber or which is equipped with an oil-free vacuum exhaust system, as well as to use a material gas with a high purity.

Thereafter, a metal element having a catalytic function of promoting crystallization is added to the surface of the amorphous semiconductor film 102 (FIG. 1B). Examples of a metal element having a catalytic function of promoting crystallization of a semiconductor film include iron (Fe), nickel (Ni), cobalt (Co), ruthenium (Ru), rhodium (Rh), palladium (Pd), osmium (Os), iridium (Ir), platinum (Pt), copper (Cu), gold (Au), and the like. One kind or a plurality of kinds selected from these elements can be used. Typically, nickel is used. The amorphous semiconductor film 102 is coated with a nickel acetate solution containing 1 to 100 ppm by weight of nickel with a spinner, thereby forming a catalytic element containing layer 103. In this case, in order to enhance compatibility of the solution, the amorphous semiconductor film 102 is subjected to a surface treatment as follows: a very thin oxide film is formed by an ozone-containing aqueous solution, the oxide film is etched with a mixed solution of fluoric acid and hydrogen peroxide to obtain a clean surface, and the resultant surface is treated with an ozone-containing aqueous solution again to form a very thin oxide film. Since the surface of a semiconductor film such as silicon is hydrophobic, the surface of the amorphous semiconductor film 102 can be uniformly coated with a nickel acetate solution by forming an oxide film as described above.

Needless to say, there is no particular limit to the method of forming the catalytic element containing layer 103, and the catalytic element containing layer 103 may be formed by sputtering, vapor deposition, plasma treatment, or the like. Furthermore, the catalytic element containing layer 103 may be formed on the base insulating film 101 before forming the amorphous semiconductor film 102.

While the amorphous semiconductor film 102 is in contact with the catalytic element containing layer 103, a heat treatment for crystallization is conducted. As a method of a heat treatment, a furnace annealing using an electrothermal furnace, or rapid thermal annealing (hereinafter, referred to as "RTA") using a halogen lamp, a metal halide lamp, a xenon arc lamp, a carbon arc lamp, a high-pressure sodium lamp, a high-pressure mercury lamp, or the like are adopted. In view of productivity, RTA is preferably adopted.

In the case of conducting RTA, a lamp light source for heating is lighted for 1 to 60 seconds, preferably 30 to 60 seconds, and lighting is repeated 1 to 10 times, preferably 2 to 6 times. The light-emitting intensity of a lamp light source is arbitrarily set; however, the intensity is set so that the semiconductor film is rapidly heated up to about 600° C. to 1000° C., preferably about 650° C. to about 750° C. Even at such a high temperature, only the semiconductor film is rapidly heated, and the substrate 100 itself is not strained to be deformed. Thus, the amorphous semiconductor film is crystallized to obtain a crystalline semiconductor film 104 as shown in FIG. 1C. Such crystallization can be achieved by providing the catalytic element containing layer 103.

In the case of using furnace annealing as other methods, prior to the heat treatment for crystallization, the amorphous semiconductor film 102 is subjected to a heat treatment at 500° C. for about one hour, whereby hydrogen contained in the amorphous semiconductor film 102 is released. Then, a heat treatment is conducted in a nitrogen atmosphere at 550° C. to 600° C., preferably at 580° C. for four hours, using an electrothermal furnace, and thus the amorphous semiconductor film 102 is crystallized. Accordingly, the crystalline semiconductor film 104 as shown in FIG. 1C is formed.

In order to enhance a crystallization ratio (ratio of a crystal component in the entire volume of the film), and correct defects remaining in the crystal grains, it is also effective to irradiate the crystalline semiconductor film 104 with laser light as shown in FIG. 1D. As a laser, excimer laser light with a wavelength of 400 nm or less, the second harmonic or the third harmonic of YAG laser is used. In any case, the crystalline semiconductor film 104 may be subjected to a laser treatment by using pulse laser light having a repeating frequency of about 10 to 1000 Hz, and condensing the laser light at 100 to 400 mJ/cm$^2$ by an optical system with an overlap ratio of 90 to 95%.

In a crystalline semiconductor film 105 thus obtained, a catalytic element (herein, nickel) remains. Although not uniformly distributed in the film, the catalytic element remains in an average concentration exceeding 1×10$^{19}$/cm$^3$. Needless to say, even in such a state, it is possible to form various semiconductor devices such as a TFT. However, the catalytic element is removed by gettering using the following method.

First, as shown in FIG. 2A, a thin layer 106 is formed on the surface of the crystalline semiconductor film 105. In the present specification, the thin layer 106 provided on the crystalline semiconductor film 105 is provided to prevent the first semiconductor film 105 from being etched when a gettering site is removed. Therefore, the thin layer 106 will be referred to as a "barrier layer 106".

The thickness of the barrier layer 106 is set to be about 1 to about 10 nm, and a chemical oxide film formed by a treatment with ozone water as a simple and easy method may be used as a barrier layer. Furthermore, even by a treatment with an aqueous solution containing a mixture of sulfuric acid, hydrochloric acid, or nitric acid and hydrogen peroxide, a chemical oxide film can be similarly formed. Alternatively, a plasma treatment in an oxygen atmosphere, oxidation treatment in which ozone is generated by irradiation with UV-light in an oxygen-containing atmosphere or the like may be conducted. Furthermore, a thin oxide film is formed to obtain a barrier layer by heating at about 200° C. to about 350° C. using a clean oven. Alternatively, an oxide film having a thickness of about 1 to 5 nm is deposited to obtain a barrier layer by plasma CVD, sputtering, vapor deposition, or the like. In any case, a film which allows a catalytic element to move to a gettering site side in the gettering process and does not allow an etchant to penetrate into the film (protects the crystalline semiconductor film 105 from an etchant) in the removing process of a gettering site may be used. For example, a silicon oxide film (SiO$_x$), a porous film or a chemical oxide film formed by a treatment with ozone water may be used.

Then, as a gettering site 107, a second semiconductor film (typically, an amorphous silicon film) containing a rare gas element in a concentration of 1×10$^{20}$/cm$^3$ or more is formed on the barrier layer 106 to a thickness of 25 to 250 nm by sputtering. The gettering site 107 to be removed later preferably forms a low-density film so as to obtain a large selection ratio of etching with respect to the crystalline semiconductor film 105.

Figure 9:
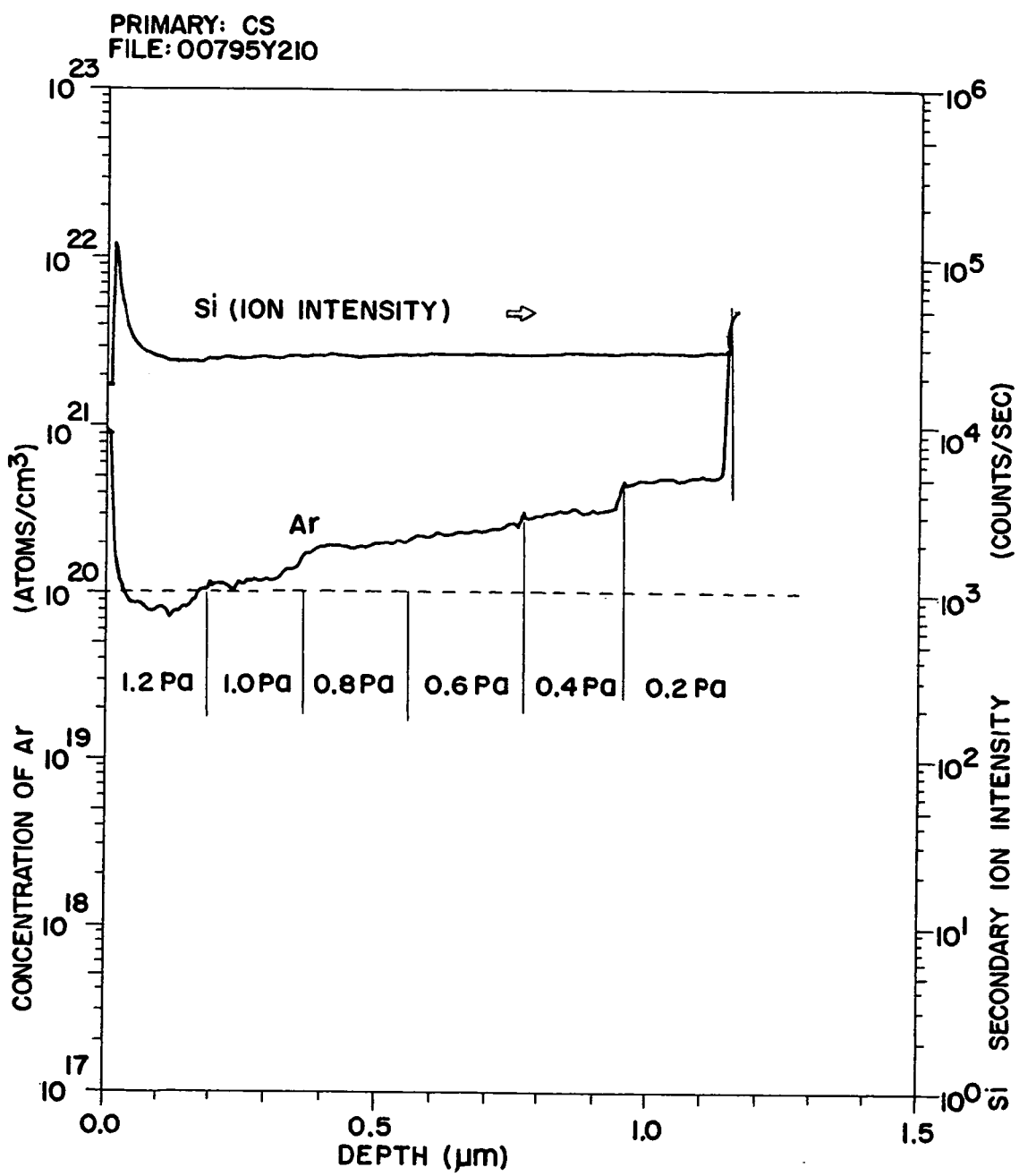
FIG. 9 is a graph showing results obtained by measuring the concentration of Ar contained in a semiconductor film.

In the present embodiment mode, the film formation pressure is varied from 0.2 to 1.2 Pa at an interval of 0.2 Pa to form a film in order, and the concentration of Ar in the formed film is measured. FIG. 9 shows the measurement results. The film formation conditions other than the pressure are as follows: a gas (Ar) flow rate is 50 (sccm), a film formation power is 3 kw, and a substrate temperature is 150° C.

It is understood from FIG. 9 that as the film formation pressure is lower, the concentration of Ar in the film is increased, and thus a film preferable as a gettering site can be formed. The reason for this is as follows: when the film formation pressure of sputtering is lower, a colliding percentage between Ar gas in a reaction chamber and hot atoms (Ar atoms reflected from a target surface) is decreased, so that recoil atoms are likely to be incident upon a substrate. As a result of the experiment, in the case of using the device of the present embodiment mode if the film formation pressure is set at 0.2 to 1.0 Pa, and the other conditions shown in Table 1 are adopted, a semiconductor film containing a rare gas element in a concentration of $1 \times 10^{19}/cm^3$ to $1 \times 10^{22}/cm^3$, preferably $1 \times 10^{20}/cm^3$ to $1 \times 10^{21}/cm^3$, more preferably $5 \times 10^{20}/cm^3$, to allow a gettering effect to be obtained can be formed by sputtering.

As being inactive itself in a semiconductor film, a rare gas element does not adversely influence the crystalline semiconductor film 105. As a rare gas element, one kind or a plurality of kinds selected from helium (He), neon (Ne), argon (Ar), krypton (Kr), and xenon (Xe) are used. The present invention is characterized in that these rare gas elements are used as ion sources for forming a gettering site, and a semiconductor film containing these elements is formed to obtain a gettering site.

In order to surely achieve gettering, it is required to conduct a heat treatment later. The heat treatment is conducted by furnace annealing or RTA. In the case of adopting furnace annealing, a heat treatment is conducted at 450° C. to 600° C. for 0.5 to 12 hours in a nitrogen atmosphere. In the case of RTA, a lamp light source for heating is lighted for 1 to 60 seconds, preferably 30 to 60 seconds, and lighting is repeated 1 to 10 times, preferably 2 to 6 times. The light-emitting intensity of a lamp light source is arbitrarily determined; however, the intensity is set so that a semiconductor film is rapidly heated to about 600° C. to about 1000° C., preferably about 700° C. to about 750° C.

During gettering, a catalytic element in a region to be gettered (capture site) is released by heat energy, and moved to a gettering site by diffusion. Thus, gettering depends upon a treatment temperature, and proceeds in a shorter period of time at a higher temperature. According to the present invention, the distance at which a catalytic element moves during gettering corresponds to approximately the thickness of a semiconductor film, as represented by an arrow in FIG. 2C, whereby gettering can be completed in a relatively short period of time.

Even in the above-mentioned heat treatment, the semiconductor film 107 containing a rare gas element in a concentration of $1 \times 10^{19}/cm^3$ to $1 \times 10^{21}/cm^3$, preferably $1 \times 10^{21}/cm^3$ to $1 \times 10^{21}/cm^3$, more preferably $5 \times 10^{20}/cm^3$ is not crystallized. The reason for this is considered as follows: a rare gas element remains in a semiconductor film without being released again even in the above-mentioned range of a treatment temperature, thereby inhibiting crystallization of the film.

Figure 14A:
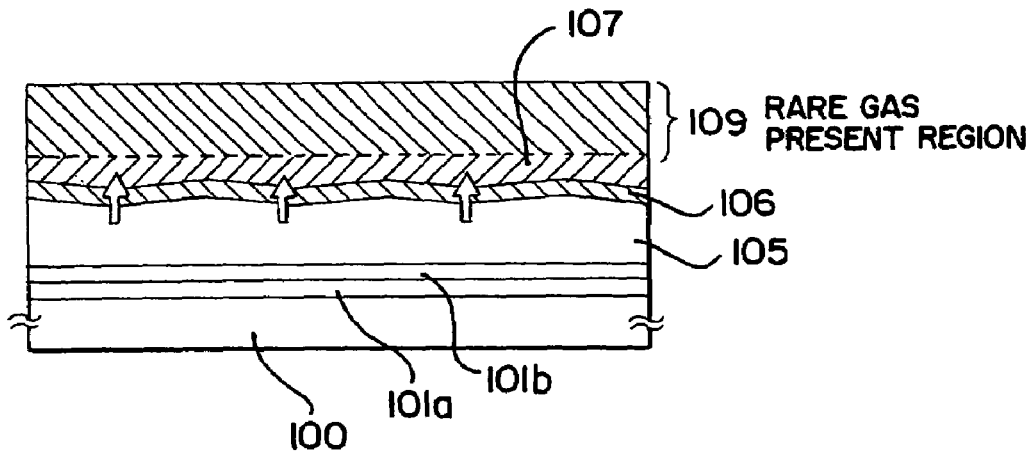
FIGS. 14A to 14C show an exemplary embodiment mode according to the present invention.
Figure 14B:
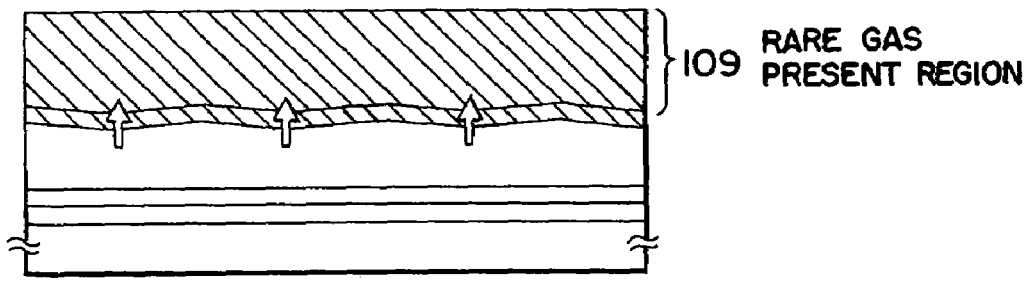
Figure 14C:
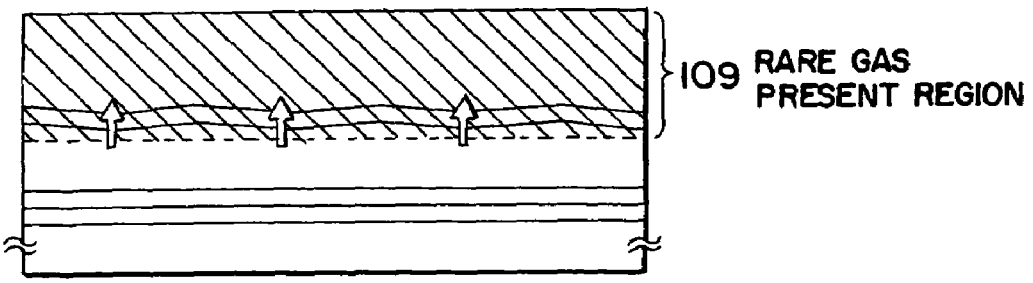

In the semiconductor film (gettering site) 107 containing rare gas, three patterns are considered as rare gas present region 109, as shown in FIGS. 14A to 14C.

FIG. 14A shows a state where a rare gas element is present up to the middle of the film thickness of the gettering site 107. In this case, a gettered catalytic element can be moved to the rare gas present region 109 away from the crystalline semiconductor film 105.

FIG. 14B shows a state where a rare gas element is present in the entire gettering site 107. In this case, since the movement distance of a catalytic element is short, gettering can be conducted in a short period of time.

FIG. 14C shows a state where a rare gas element is present passing through the barrier layer 106 from the gettering site 107 to reach the crystalline semiconductor film 105. It is considered that the barrier layer 106 becomes porous due to the influence of the rare gas elements with different atom sizes. Therefore, a catalytic element is likely to move to the gettering site 107. As being inactive itself in a semiconductor film, a rare gas element does not adversely influence the crystalline semiconductor film 105.

Even if either of sputtering or plasma CVD is used, by changing the power of film formation, the rare gas present regions shown in FIGS. 14A to 14C can be obtained.

After completion of gettering, the amorphous semiconductor 107 is removed by selective etching. Etching can be conducted by dry etching of $ClF_3$, without using plasma, or wet etching with an alkaline solution such as hydrazine and an aqueous solution containing tetraethyl ammonium hydroxide $((CH_3)_4NOH)$. At this time, the barrier layer 106 functions as an etching stopper. The barrier layer 106 may be removed with fluoric acid thereafter.

Accordingly, a crystalline semiconductor film 108 with a concentration of a catalytic element reduced to $1 \times 10^{17}/cm^3$ or less can be obtained as shown in FIG. 2C. The crystalline semiconductor film 108 is formed as a thin bar-shaped or thin flat bar-shaped crystal due to the function of a catalytic element, and each crystal is grown with a certain specified directivity when seen macroscopically. The crystalline semiconductor film 108 is applicable to a photoelectric conversion layer of a photosensor and a solar battery, as well as an active layer of a TFT.

Embodiment Mode 2

A semiconductor film containing a rare gas element can also be formed as a gettering site by plasma CVD.

The barrier layer 106 is formed in the same way as in Embodiment Mode 1, and thereafter, the semiconductor film 107 containing a rare gas element is formed on the barrier layer 106 to a thickness of 25 to 250 nm by plasma CVD.

Under a state where a material gas is set to be $Ar:SiH_4=500:100$ (sccm), a film formation pressure is 33.3 Pa, a power is 35 W, and a substrate temperature is 300° C., the semiconductor film 107 containing a rare gas element is formed, and thereafter, a heat treatment is conducted, and thus a catalytic element in the crystalline semiconductor film 105 can be moved to the gettering site (semiconductor film containing rare gas) 107. Thus, even if the gettering site is formed by plasma CVD, the crystalline semiconductor film 108 with a concentration of a catalytic element reduced to $1 \times 10^{17}/cm^3$ or less can be obtained.

As shown in FIG. 17C, after the semiconductor film 107 containing rare gas is formed, a rare gas element (one kind or a plurality of kinds selected from helium (He), neon (Ne), argon (Ar), krypton (Kr), and xenon (Xe)) may be added to the semiconductor film 107 containing rare gas by ion doping. Thus, by adding rare gases with different atom sizes after the semiconductor film 107 containing rare gas is formed, the barrier layer 106 can be made porous. Furthermore, a larger strain is caused in the semiconductor film 107, whereby an etching selection ratio can be increased between the crystalline semiconductor film 105 and the semiconductor film 107.

Embodiment Mode 3

FIGS. 7A to 7E illustrate one embodiment mode of the present invention. A method will be described in which a semiconductor film with a crystal structure is formed by a heat treatment, gettering is conducted, and crystallinity of the semiconductor film is enhanced by irradiation with strong light such as laser light. In FIGS. 7A to 7E, the same reference numerals as those in Embodiment Mode 1 shown in FIGS. 1 and 2 are used.

Figure 7A:
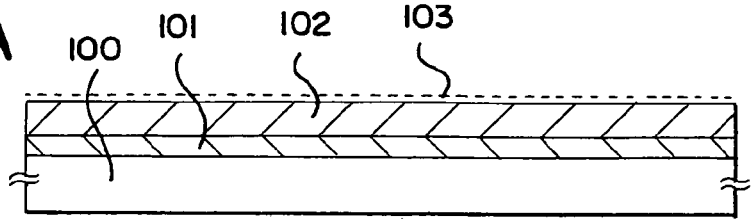
FIGS. 7A to 7E illustrate an exemplary embodiment mode according to the present invention.
Figure 7B:
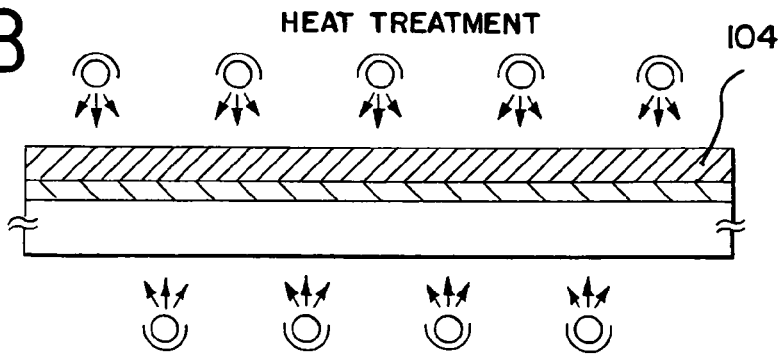

FIGS. 7A and 7B show the same processes as those in Embodiment Mode 1. The base insulating film 101, the amorphous semiconductor film 102, and the catalytic element containing layer 103 are formed on the substrate 100, and thereafter, the crystalline semiconductor film 104 is formed by a heat treatment.

Figure 7C:
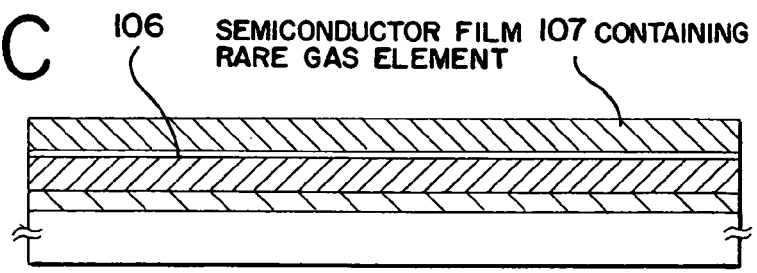

Then, as shown in FIG. 7C, the barrier layer 106 is formed on the surface of the crystalline semiconductor film 104, and the semiconductor film 107 containing a rare gas element is formed. The semiconductor film 107 is formed by sputtering or plasma CVD so as to contain a rare gas element in a concentration of $1 \times 10^{20}$ to $2.5 \times 10^{22}/cm^3$ during film formation.

Figure 7D:
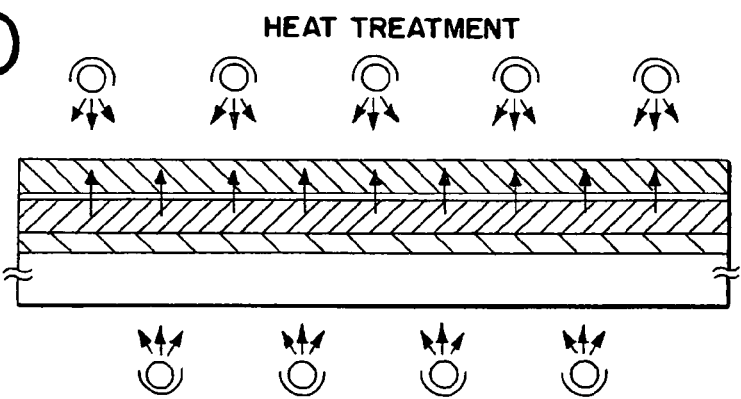

As shown in FIG. 7D, a heat treatment is conducted by furnace annealing or RTA. In the case of using furnace annealing, a heat treatment is conducted at 450° C. to 600° C. for 0.5 to 12 hours in a nitrogen atmosphere. In the case of RTA, a lamp light source for heating is lighted for 1 to 60 seconds, preferably 30 to 60 seconds, and lighting is repeated 1 to 10 times, preferably 2 to 6 times. The light-emitting intensity of a lamp light source is arbitrarily determined; however, the intensity is set so that a semiconductor film is rapidly heated to about 600° C. to about 1000° C., preferably about 700° C. to about 750° C. Even if the semiconductor film is irradiated with the second harmonic (wavelength: 532 nm) of YAG laser, YLF laser, or $YVO_4$ laser, gettering can be conducted. During gettering, a catalytic element in a capture site is released by heat energy and moved to a gettering site by diffusion. Thus, gettering depends upon a treatment temperature, and proceeds in a short period of time at a higher temperature. The distance at which a catalytic element moves corresponds to approximately the thickness of the semiconductor film, as represented by an arrow in FIG. 7D, whereby gettering is completed in a relatively short period of time.

Even in the above-mentioned heat treatment, the semiconductor film 107 containing a rare gas element in a concentration of $1 \times 10^{19}/cm^3$ to $1 \times 10^{22}/cm^3$, preferably $1 \times 10^{20}/cm^3$ to $1 \times 10^{21}/cm^3$, more preferably $5 \times 10^{20}/cm^3$ is not crystallized. The reason for this is considered as follows: a rare gas element remains in the film without being released again even in the above-mentioned range of a treatment temperature, thereby inhibiting crystallization of the semiconductor film.

Thereafter, the semiconductor film 107 is removed by selective etching. Etching can be conducted by dry etching of $ClF_3$, without using plasma, or wet etching with an alkaline solution such as hydrazine and an aqueous solution containing tetraethyl ammonium hydroxide (($CH_3)_4NOH$). At this time, the barrier layer 106 functions as an etching stopper. The barrier layer 106 may be removed with fluoric acid thereafter.

Figure 7E:
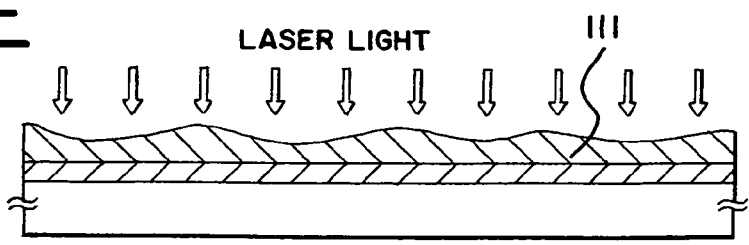

In order to enhance a crystallization ratio (ratio of a crystal component in the entire volume of the film), and correct defects remaining in the grains, it is also effective to irradiate the semiconductor film 104 having a crystal structure with laser light as shown in FIG. 7E. As a laser, excimer laser light with a wavelength of 400 nm or less, the second harmonic or the third harmonic of YAG laser is used. In any case, the semiconductor film 104 may be subjected to a laser treatment by using pulse laser light having a repeating frequency of about 10 to 1000 Hz, and condensing the laser light at 100 to 400 $mJ/cm^2$ by an optical system to irradiate with an overlap ratio of 90 to 95%, and forming the crystalline semiconductor film 108.

Embodiment Mode 4

FIG. 8 illustrates one embodiment mode of the present invention, in which a metal element having a catalytic function is added to the entire surface of an amorphous semiconductor film so as to crystallize the film, while gettering is simultaneously conducted.

Figure 8A:
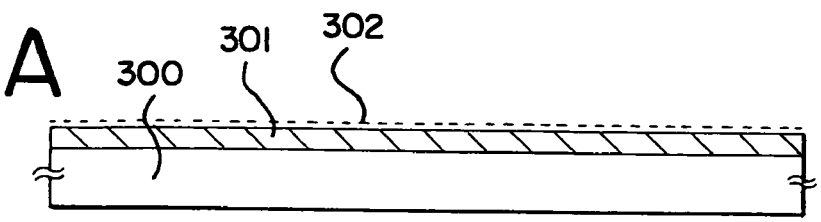
FIGS. 8A to 8E illustrate an exemplary embodiment mode according to the present invention.

First, as shown in FIG. 8A, a catalytic element containing layer 302 is formed on a base insulating film 301. At this time, the catalytic element containing layer 302 may be coated with an aqueous solution containing a catalytic element or alcohol solution with a spinner. Alternatively, the catalytic element containing layer 302 may be formed by sputtering, vapor deposition, a plasma treatment, or the like.

Figure 8B:
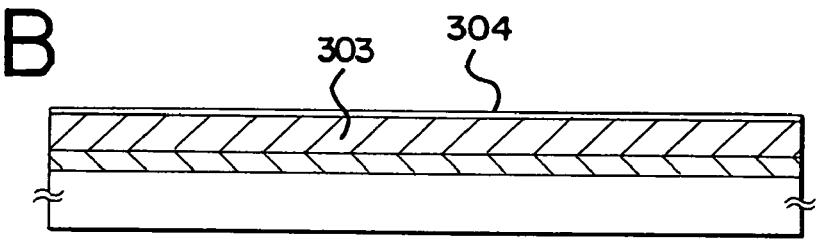

Thereafter, an amorphous semiconductor film 303 is formed into a thickness of 10 to 100 nm by plasma CVD, low-pressure CVD, or sputtering, as shown in FIG. 8B. Furthermore, a barrier layer 304 is formed. The method of forming these films is the same as that in Embodiment Mode 1.

Figure 8C:
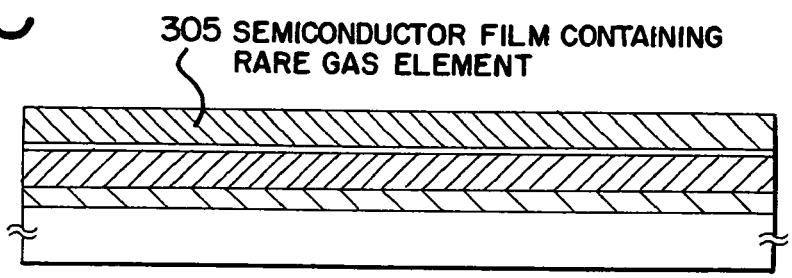

Then, as shown in FIG. 8C, a semiconductor film 305 containing a rare gas element in a concentration of $1 \times 10^{19}/cm^3$ to $1 \times 10^{22}/cm^3$, preferably $1 \times 10^{20}$ to $1 \times 10^{21}/cm^3$, more preferably $5 \times 10^{20}/cm^3$ is formed into a thickness of 25 to 250 nm by sputtering described in Embodiment Mode 1 or plasma CVD described in Embodiment Mode 2. Typically, an amorphous silicon film is selected. Since the semiconductor film 305 will be removed later, a low-density film is desirably formed.

Figure 8D:
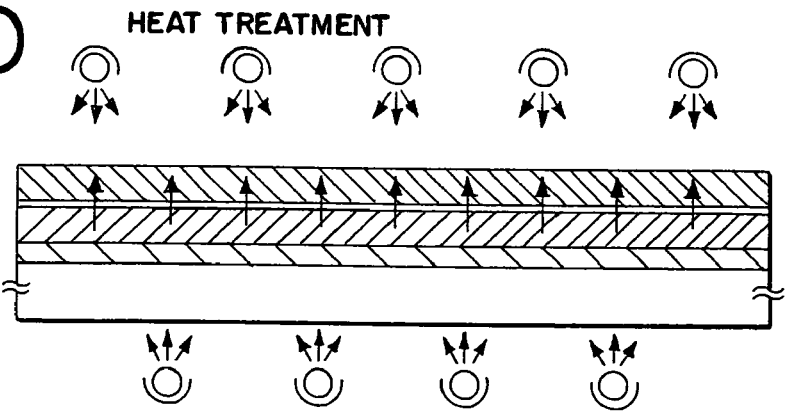

Next, as shown in FIG. 8D, a heat treatment is conducted. As a method of a heat treatment, a furnace annealing using an electrothermal furnace, or RTA using a halogen lamp, a metal halide lamp, a xenon arc lamp, a carbon arc lamp, a high-pressure sodium lamp, a high-pressure mercury lamp, or the like are conducted.

In the case of conducting RTA, a lamp light source for heating is lighted for 1 to 60 seconds, preferably 30 to 60 seconds, and lighting is repeated 1 to 10 times, preferably 2 to 6 times. The light-emitting intensity of a lamp light source is arbitrarily determined; however, the intensity is set so that a semiconductor film is rapidly heated to about 600° C. to about 1000° C., preferably about 650° C. to about 750° C. Even at such a high temperature, only the semiconductor film is rapidly heated, and the substrate 100 itself is not strained to be deformed. In the case of conducting furnace annealing, prior to the heat treatment for crystallization, hydrogen of the semiconductor film 303 having an amorphous structure is released by a heat treatment at 500° C. for about one hour. Then, a heat treatment is conducted in a nitrogen atmosphere at 550° C. to 600° C., preferably at 580° C. for four hours, using an electrothermal furnace, thereby crystallizing the semiconductor film 303.

In the above-mentioned heat treatment, a catalytic element permeates into the semiconductor film 303 having an amorphous structure, and diffuses toward the semiconductor film 305 (in a direction represented by an arrow in FIG. 8D) while crystallizing the semiconductor film 303. Because of this, crystallization and gettering are simultaneously conducted by one heat treatment.

Thereafter, the semiconductor film 305 is removed by selective etching. Etching can be conducted by dry etching of $ClF_3$, without using plasma, or wet etching with an alkaline solution such as hydrazine and an aqueous solution containing tetraethyl ammonium hydroxide (($CH_3)_4NOH$). At this time, the barrier layer 304 functions as an etching stopper. The barrier layer 304 may be removed with fluoric acid thereafter.

Figure 8E:
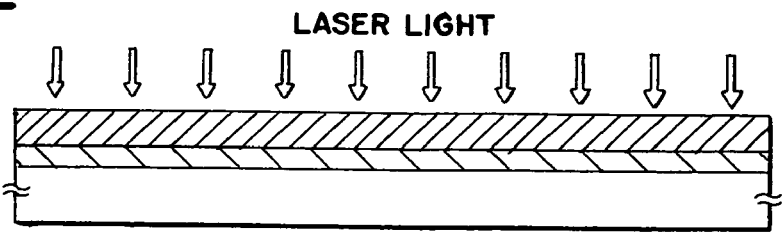

Thus, a semiconductor film (first semiconductor film) 306 having a crystal structure with a concentration of a catalytic element reduced to $1\times10^{17}/\text{cm}^3$ or less can be obtained as shown in FIG. 8E. In order to enhance the crystallinity of the crystalline semiconductor film 306, the semiconductor film 306 may be irradiated with laser light in the same way as in Embodiment Mode 1.

The crystalline semiconductor film 306 thus formed is formed as a thin bar-shaped or thin flat bar-shaped crystal due to the function of a catalytic element, and each crystal is grown with a certain specified directivity when seen macroscopically. The crystalline semiconductor film 306 is applicable to a photoelectric conversion layer of a photosensor and a solar battery, as well as an active layer of a TFT.

EMBODIMENTS

Embodiment 1

The present invention will be described by way of illustrative embodiments with reference to FIGS. 1A–1D to FIG. 6. Herein, a method will be described in detail for simultaneously manufacturing a pixel portion and a TFT (n-channel TFT and p-channel TFT) of a driving circuit provided on the periphery of the pixel portion on the same substrate will be described in detail.

In FIG. 1A, as a substrate 100, a glass substrate, a quartz substrate, a ceramic substrate, or the like can be used. Alternatively, a silicon substrate, a metal substrate or a stainless substrate with an insulating film formed thereon may be used. Furthermore, a plastic substrate having heat resistance with standing a treatment temperature of the present embodiment may be used.

As shown in FIG. 1A, a base insulating film 101 made of an insulating film such as a silicon oxide film, a silicon nitride film or a silicon oxynitride film ($SiO_xN_y$) is formed. A typical example of the base insulating film 101 has a two-layered structure in which a first silicon oxynitride film 101a is formed into a thickness of 50 to 100 nm by using $SiH_4$, $NH_3$ and $N_2O$ as a reaction gas and a second silicon oxynitride film 101b is formed into a thickness of 100 to 150 nm by using $SiH_4$ and $N_2O$ as a reaction gas.

A semiconductor film to be an active layer is obtained by crystallizing an amorphous semiconductor film formed on the base insulating film 101. An amorphous semiconductor film 102 is formed into a thickness of 30 to 60 nm. Thereafter, the surface of the amorphous semiconductor film 102 is coated with a nickel acetate solution containing a metal element (in the present embodiment nickel) having a catalytic function of promoting crystallization in an amount of 1 to 100 ppm by weight, using a spinner, thereby forming a catalytic element containing layer 103 (FIG. 1B).

While the amorphous semiconductor film 102 is in contact with the catalytic element containing layer 103, a heat treatment is conducted for crystallization. In the present embodiment the heat treatment is conducted by RTA. A lamp light source for heating is lighted for 1 to 60 seconds, preferably 30 to 60 seconds, and lighting is repeated 1 to 10 times, preferably 2 to 6 times. The light-emitting intensity of the lamp light source is arbitrarily determined; however, the intensity is set so that the semiconductor film is rapidly heated to about 600° C. to about 1000° C., preferably about 650° C. to about 750° C. Even at such a high temperature, only the semiconductor film is rapidly heated, and the substrate 100 itself is not strained to be deformed. Thus, the amorphous semiconductor film 102 is crystallized to obtain a crystalline semiconductor film 104 as shown in FIG. 1C.

Furthermore, in order to enhance a crystallization ratio (ratio of a crystal component in the entire volume of the film), and correct defects remaining in the grains, the crystalline semiconductor film 104 is irradiated with laser light as shown in FIG. 1D. As a laser, excimer laser light with a wavelength of 400 nm or less, the second harmonic or the third harmonic of YAG laser is used. In any case, the crystalline semiconductor film 104 may be subjected to a laser treatment by using pulse laser light having a repeating frequency of about 10 to 1000 Hz, and condensing the laser light at 100 to 400 $mJ/cm^2$ by an optical system with an overlap ratio of 90 to 95%. Thus, a crystalline semiconductor film 105 is obtained.

Then, in order to remove the catalytic element contained in the crystalline semiconductor film 105, gettering is conducted. As shown in FIG. 2A, a barrier layer 106 is formed on the crystalline semiconductor film 105, as shown in FIG. 2A. As the barrier layer 106, a porous film that is capable of allowing the catalytic element (nickel) to pass therethrough to a gettering site, and prevents an etchant used in the process of removing the gettering site from permeating is formed. For example, a chemical oxide film or a silicon oxide film ($SiO_x$) formed by a treatment with ozone water may be used. In the present specification, a film having such a property is particularly referred to as a porous film.

Then, a semiconductor film 107 containing a rare gas element is formed as the gettering site. In the present embodiment the semiconductor film 107 is formed so as to contain a rare gas element in a concentration of $1\times10^{19}$ to $1\times10^{22}/\text{cm}^3$, preferably $1\times10^{20}$ to $1\times10^{21}/\text{cm}^3$, more preferably $5\times10^{20}/\text{cm}^3$ under the condition of an Ar flow rate of 50 sccm, a film formation pressure of 0.2 Pa, a power of 3 kW, and a substrate temperature of 150° C.

Thereafter, a heat treatment is conducted by using RTA and thus the catalytic element is moved to the gettering site in the vertical direction. The heating conditions are as follows: a lamp light source for heating is lighted for 1 to 60 seconds, preferably 30 to 60 seconds, and lighting is repeated 1 to 10 times, preferably 2 to 6 times. The light-emitting intensity of a lamp light source is arbitrarily determined; however, the intensity is set so that the semiconductor film is rapidly heated to about 600° C. to about 1000° C., preferably about 700° C. to about 750° C.

After completion of gettering, the amorphous semiconductor 107 is removed by selective etching. Etching can be conducted by dry etching of $ClF_3$, without using plasma, or wet etching with an alkaline solution such as hydrazine and an aqueous solution containing tetraethyl ammonium hydroxide (($CH_3)_4NOH$). At this time, the barrier layer 106 functions as an etching stopper. The barrier layer 106 may be removed with fluoric acid thereafter.

In order to improve crystallization, laser light may be irradiated after the crystallization process. Thereafter, the resultant crystalline semiconductor film is etched to a desired shape to obtain semiconductor layers 1102 to 1106 separated in an island-like manner.

After the semiconductor layers 1102 to 1106 are formed, an impurity element imparting a p-type may be added to control a threshold value ($V_{th}$) of an n-channel TFT. As an impurity element imparting a p-type to a semiconductor, elements belonging to Group 13 of the periodic law such as boron (B), aluminum (Al) and gallium (Ga) are known.

Then, a gate insulating film 1107 for covering the semiconductor layers 1102 to 1106 separated in an island-like manner is formed. The gate insulating film 1107 is formed of an insulating film (thickness: 40 to 150 nm) containing silicon by plasma CVD or sputtering. Needless to say, the gate insulating film 1107 can have a single-layer or multi-layer structure of an insulating film containing silicon.

In the case of using a silicon oxide film, the gate insulating film can be formed by mixing TEOS (tetraethyl ortho silicate) and $O_2$, and discharging at a reaction pressure of 40 Pa, a substrate temperature of 300° C. to 400° C., a high-frequency (13.56 MHz) electric power density of 0.5 to 0.8 W/cm$^2$ by plasma CVD. The silicon oxide film thus produced exhibits satisfactory characteristics as a gate insulating film by thermal annealing at 400° C. to 500° C. after formation of the silicon oxide film.

On the gate insulating film 1107, a tantalum nitride (TaN) 1108 as a first conductive film (thickness: 20 to 100 nm) and tungsten (W) 1109 as a second conductive film (thickness: 100 to 400 nm) are stacked on top of the other. As a conductive material for forming a gate electrode, an element selected from Ta, W, Ti, Mo, Al, and Cu, or an alloy material or a compound material containing the element as its main component is used. Furthermore, a semiconductor film such as a polycrystalline silicon film doped with an impurity element such as phosphorus may be used. Furthermore, the following combinations may be used: a combination of a tantalum (Ta) film as a first conductive film and a W film as a second conductive film; a combination of a tantalum nitride (TaN) film as a first conductive film and an Al film as a second conductive film; and a combination of a tantalum nitride (TaN) film as a first conductive film and a Cu film as a second conductive film.

Next, masks 1110 to 1115 made of a resist are formed by exposure to light, as shown in FIG. 3B, and first etching is conducted for forming a gate electrode and wiring. Inductively coupled plasma (ICP) etching may be used. There is no particular limit to etching gas; however, $CF_4$, $Cl_2$, and $O_2$ are preferably used for etching W and TaN. Etching is conducted by generating plasma with an RF (13.56 MHz) electric power of 500 W supplied to a coil-type electrode under a pressure of 1 Pa at a gas flow rate ratio of 25/25/10 sccm. An RF (13.56 MHz) electric power of 150 W is supplied to a substrate side (sample stage) and thus a substantially negative self-bias voltage is applied. Under the first etching condition, the W film is etched, and ends of the first conductive layer are tapered.

Thereafter, when using $CF_2$ and $CL_2$ as etching gas for the second etching condition, second etching is conducted for about 30 seconds by generating plasma with an RF (13.56 MHz) electric power of 500 W supplied to a coil-type electrode under a pressure of 1 Pa at a gas flow rate ratio of 30/30 (sccm). An RF (13.56 MHz) electric power of 20 W is also supplied to a substrate side (sample stage), and a substantially negative self-bias voltage is applied. Under the second etching condition in which $CF_4$ is mixed with $Cl_2$, the W film and the TaN film are etched to the same degree. In order to conduct etching without leaving a residue on the gate insulating film, an etching time may be increased at a rate of about 10% to about 20%.

In the first etching, the shape of a mask made of a resist is rendered appropriate, whereby ends of the first and second conductive layers are tapered due to the effect of a bias voltage applied to the substrate side. The taper angle becomes 15° to 45°. Because of the first etching, first-shaped conductive layers 1117 to 1122 composed of first conductive layers and second conductive layers (first conductive layers 1117a to 1122a and second conductive layers 1117b to 1122b) are formed. Reference numeral 1116 denotes a gate insulating film, and regions of the gate insulating film 1116 not covered with the first-shaped conductive layers 1117 to 1122 are etched by about 20 to 50 nm to be thin.

Next, without removing the masks 1110 to 1115 made of a resist, second etching is conducted, as shown in FIG. 3C. When using $CF_4$, $CL_2$ and $O_2$ as etching gas, the second etching is conducted by generating plasma with an RF (13.56 MHz) electric power of 500 W supplied to a coil-type electrode under a pressure of 1 Pa at a gas flow rate ratio of 20/20/20 sccm. An RF (13.56 MHz) electric power of 20 W is supplied to a substrate side (sample stage) and thus a self-bias voltage lower than that of the first etching is applied thereto. The W film is etched under the third etching condition. The W film is anisotropically etched under the third etching condition, whereby second-shaped conductive layers 1124 to 1129 (first conductive layers 1124a to 1129a and second conductive layers 1124b to 1129b) are formed. Reference numeral 1123 denotes a gate insulating film, and regions of the gate insulating film 1123 not covered with the first-shaped conductive layers 1117 to 1122 are etched by about 20 to 50 nm to be thin.

An etching reaction effected by a mixed gas of $CF_4$ and $Cl_2$ with respect to the W film and the TaN film can be presumed from the vapor pressure of generated radicals or ion species and reaction products. When the vapor pressures of fluorides and chlorides of W and TaN are compared with each other, the vapor pressure of $WF_6$ that is a fluoride of W is extremely high, and the vapor pressures of $WCl_5$, $TaF_5$, and $TaCl_5$ are substantially the same. Thus, the W film and the TaN film are etched together with a mixed gas of $CF_4$ and $Cl_2$. However, when an appropriate amount of $O_2$ is added to the mixed gas, $CF_4$ is reacted with $O_2$ to generate CO and F, and F radials or F ions are generated in a large amount. As a result, an etching speed of a W film of which fluoride has a high vapor pressure increases. On the other hand, even if F is increased, an increase in an etching speed of TaN is relatively small. Furthermore, TaN is likely to be oxidized compared with W, so that the surface of TaN is more or less oxidized by adding $O_2$. Since an oxide of TaN is not reacted with fluoride or chloride, the etching speed of the TaN film is further decreased. Thus, the difference in etching speed can be formed between the W film and the TaN film, and the etching speed of the W film can be increased, compared with that of the TaN film.

First doping is conducted without removing a resist mask, and an impurity element imparting an n-type is added to the semiconductor layer. Doping may be conducted by ion doping or ion implantation. Ion doping is conducted at a dose amount of $1.5 \times 10^{14}$ atoms/cm$^2$ and an accelerating voltage of 60 to 100 keV. As an impurity element imparting an n-type, an element belonging to Group 15 (typically phosphorus (P) or arsenic (As)) is used. In this case, the second-shaped conductive layers 1124 to 1128 function as masks with respect to the impurity element imparting an n-type, and first impurity regions 1130 to 1134 are formed in a self-alignment manner. An impurity element imparting an n-type is added to the first impurity regions 1130 to 1134 in a concentration range of $1 \times 10^{16}$ to $1 \times 10^{17}$/cm$^3$.

Then, as shown in FIG. 4A, resist masks 1135 and 1136 are formed, and second doping is conducted. The resist mask 1135 protects a channel formation region of the semiconductor layer in which a p-channel TFT of a driving circuit is formed and a region on its periphery. The resist mask 1136 protects a channel formation region of the semiconductor layer in which a TFT of a pixel portion is formed and a region on its periphery.

In second doping, phosphorus (P) ions are doped at a dose amount of $1.5 \times 10^{15}$ atoms/cm$^2$ and an accelerating voltage of 60 to 100 keV. Herein, an impurity region is formed in each semiconductor layer by utilizing the difference in thickness of the second-shaped conductive layers 1124 to 1128 and the gate insulating film 1123. Needless to say, phosphorus (P) is not added to regions covered with the masks 1135 and 1136. Thus, second impurity regions 1180 to 1182 and third impurity regions 1137 to 1141 are formed. An impurity element imparting an n-type is added to the third impurity regions 1137 to 1141 in a concentration range of $1×10^{20}$ to $1×10^{21}/cm^3$. Furthermore, the second impurity region is formed so as to have a concentration lower than that of the third impurity region due to the difference in thickness of the gate insulating film, and an impurity element imparting an n-type is added to the second impurity region in a concentration range of $1×10^{18}$ to $1×10^{19}/cm^3$.

Figure 4B:
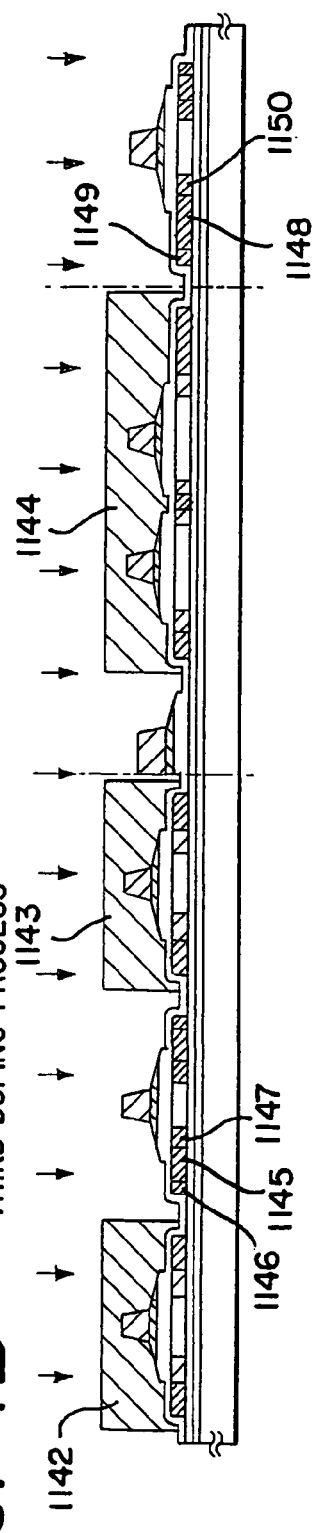
Figure 4C:
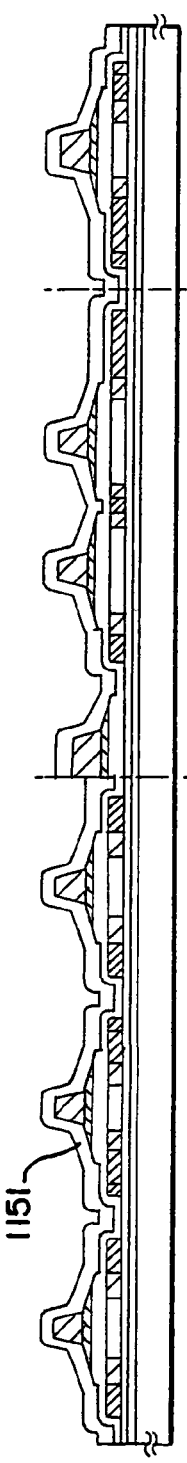

Then, resist masks 1142 to 1144 are newly formed, and third doping is conducted, as shown in FIG. 4B. Because of the third doping, fourth impurity regions 1147 and fifth impurity regions 1145 and 1146 with an impurity element imparting a p-type conductivity added thereto are formed in the semiconductor layer in which a p-channel TFT is formed. The fourth impurity region 1147 is formed, overlapped with the second-shaped conductive layer, in such a manner that an impurity element imparting a p-type conductivity is added in a concentration range of $1×10^{18}$ to $1×10^{20}/cm^3$. Furthermore, the fifth impurity regions 1145 and 1146 are designed so as to be supplied with an impurity element imparting a p-type conductivity in a concentration range of $1×10^{20}$ to $1×10^{21}/cm^3$. Note that, the fifth impurity region 1146 is supplied with phosphorus (P) in the previous process, which has a p-type conductivity with an impurity element imparting a p-type conductivity added thereto in 1.5 to 3 times concentration thereof.

Fifth impurity regions 1148 and 1149, and a fourth impurity region 1150 are formed in the semiconductor layer in which a storage capacitor is formed in a pixel portion.

During the above-mentioned processes, an impurity region having an n-type or p-type conductivity is formed in each semiconductor layer. The second-shaped conductive layers 1124 to 1127 become gate electrodes. Furthermore, the second-shaped conductive layer 1128 becomes one of electrodes forming a storage capacitor in the pixel portion. Furthermore, the second-shaped conductive layer 1129 forms a source wiring in the pixel portion.

Then, a first interlayer insulating film 1151 is formed so as to cover substantially the entire surface of the layered structure. The first interlayer insulating film 1151 is composed of an insulating film containing silicon and hydrogen with a thickness of 100 to 200 nm by plasma CVD or sputtering. A preferable example of the first interlayer insulating film 1151 is a silicon oxynitride film with a thickness of 150 nm formed by plasma CVD. Needless to say, the first interlayer insulating film 1151 is not limited to a silicon oxynitride film. A single-layer or multi-layer structure of an insulating film containing other silicon may also be used.

Thereafter, an impurity element added to each semiconductor layer is activated. The activation is realized by conducting a heat treatment, using an annealing furnace or a clean oven. A heat treatment is conducted at 400° C. to 700° C., typically 410° C. to 500° C. in a nitrogen atmosphere. In addition to this, laser annealing or rapid thermal annealing (RTA) can be applied.

At the same time with the above-mentioned activation, nickel used as a catalyst for crystallization is gettered in the third impurity regions 1137, 1139, and 1140, and the fifth impurity regions 1146 and 1149 containing phosphorus in a high concentration, and mainly the concentration of nickel in the semiconductor layer to be a channel formation region is reduced. As a result, an off-current value of a TFT having a channel formation region is decreased, and high field-effect mobility is obtained due to satisfactory crystallinity, whereby satisfactory characteristics can be achieved.

Figure 5:
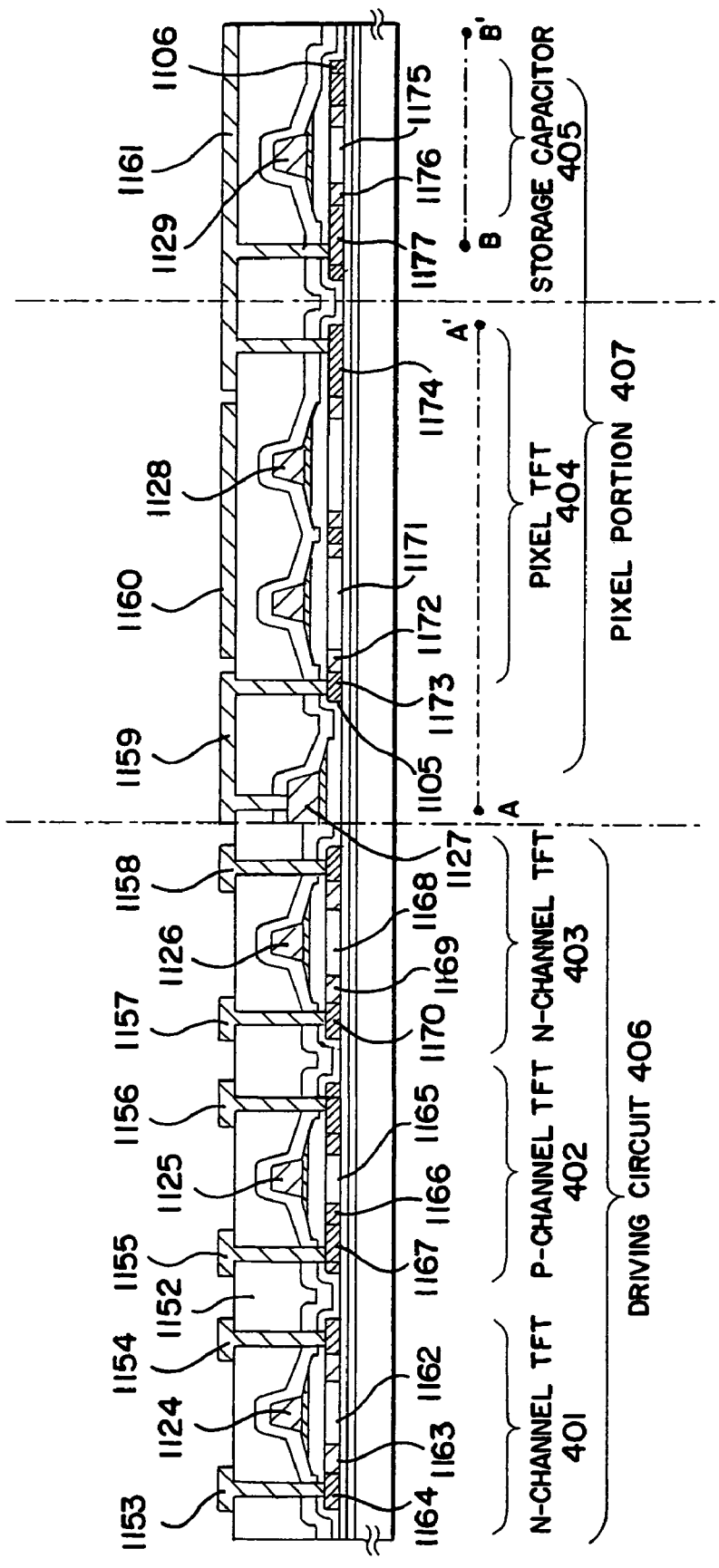
FIG. 5 illustrates an embodiment of the present invention.

Then, as shown in FIG. 5, a second interlayer insulating film 1174 made of an organic insulating material is formed on the first interlayer insulating film 1151. Then, a contact hole reaching a source wiring 1127 and a contact hole reaching each impurity region are formed.

Thereafter, wiring and pixel electrodes are formed using Al, Ti, Mo, W, and the like. For example, a laminate film of a Ti film (thickness: 50 to 250 nm) and an alloy film (alloy film of Al and Ti) (thickness: 300 to 500 nm) is used. Accordingly, source/drain wirings 1153 to 1158, a gate wiring 1160, a connection wiring 1159, and a pixel electrode 1161 are formed.

Thus, a driving circuit 406 including an n-channel TFT 401, a p-channel TFT 402, and an n-channel TFT 403 and a pixel portion 407 including an n-channel TFT 404 and a storage capacitor 405 can be formed on the same substrate. In the present specification, such a substrate is referred to as an active matrix substrate for convenience. The TFT in the pixel portion 407 may be a p-channel TFT.

The n-channel TFT 401 (second n-channel TFT) in the driving circuit 406 includes a channel formation region 1162, a second impurity region 1163 partially overlapped with the second-shaped conductive layer 1124 forming a gate electrode, and a third impurity region 1164 that functions as a source/drain region. The p-channel TFT 402 includes a channel formation region 1165, a fourth impurity region 1166 partially overlapped with a second-shaped conductive layer 1125 forming a gate electrode, and a fourth impurity region 1167 that functions as a source/drain region. The n-channel TFT 403 (second n-channel TFT) includes a channel formation region 1168, a second impurity region 1169 partially overlapped with a second-shaped conductive layer 1126 forming a gate electrode, and a third impurity region 1170 that functions as a source/drain region. By using such an n-channel TFT and a p-channel TFT, a shift register circuit, a buffer circuit, a level shifter circuit, a latch circuit, and the like can be formed. In particular, the structure of the n-channel TFT 401 or 403 is suitable for a buffer circuit with a high driving voltage for the purpose of preventing deterioration due to hot carrier effects.

The pixel TFT 404 (first n-channel TFT) in the pixel portion 407 includes a channel formation region 1171, a first impurity region 1172 formed outside of the second-shaped conductive layer 1128 forming a gate electrode, and a third impurity region 1173 that functions as a source/drain region. Furthermore, in a semiconductor layer that functions as one of the electrodes of the storage capacitor 405, a fourth impurity region 1176 and a fifth impurity region 1177 are formed. The storage capacitor 405 is composed of a second-shaped electrode 1129 and a semiconductor layer 1106, using an insulating film (same as the gate insulating film) as a dielectric.

FIG. 6 shows a top view of the pixel portion 407. FIG. 6 shows a top view of almost one pixel, and reference numerals used therein are the same as those in FIG. 5. Furthermore, cross-sectional structures taken along the lines A–A' and B–B' correspond to FIG. 5. In the pixel structure shown in FIG. 6, by forming a gate wiring and a gate electrode on different layers, the gate wiring can be overlapped with the semiconductor layer, and the gate wiring is additionally provided with a function as a light-shielding film. Furthermore, ends of the pixel electrode are disposed to be overlapped with the source wiring so that a gap between the pixel electrodes is light-shielded, whereby a light-shielding film (black matrix) can be omitted. As a result, compared with the prior art, an opening ratio can be enhanced.

According to the present invention, the structure of a TFT forming each circuit is optimized in accordance with a circuit specification required by a pixel portion and a driving circuit, and operation performance and reliability of a semiconductor device can be enhanced. More specifically, due to an n-channel TFT, an LDD structure is varied in accordance with a circuit specification. As described above, an n-channel TFT in the driving circuit has an LDD structure partially overlapped with a gate electrode, whereby the TFT is mainly prevented from being degraded due to hot carrier effects. An n-channel TFT in the pixel portion has an LDD structure not overlapped with a gate electrode, which is effectively for mainly reduction in an off current. According to the present invention, there is provide a technique for forming n-channel TFTs having different structures and a p-channel TFT are formed on the same substrate, which is realized by using six photomasks. Furthermore, although one more photomask is required, by forming the pixel electrode of a transparent conductive film, a transmission-type display device can be formed.

Embodiment 2

In the present embodiment, the present invention is applicable to manufacturing processes of a bottom gate type TFT. Manufacturing processes of a bottom gate type TFT will be briefly described with reference to FIGS. 15A–15E and 16A–16C.

Figure 15A:
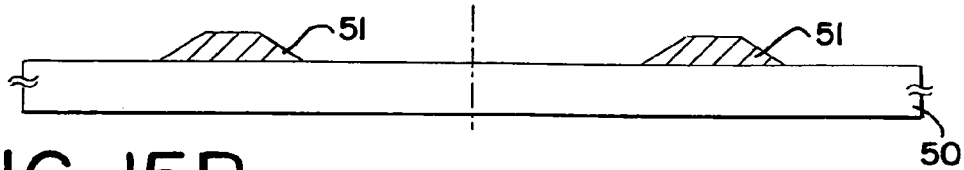
FIGS. 15A to 15E illustrate an embodiment of the present invention.

An insulating film (not shown) such as a silicon oxide film, a silicon nitride film, or a silicon oxynitride film is formed on a substrate 50. A conductive film for forming gate electrodes is formed, and patterned to a predetermined shape to obtain gate electrodes 51. An element selected from Ta, Ti, W, Mo, Cr, or Al is used for the conductive film. Alternatively, a conductive film containing any of these elements as its main component may be used (FIG. 15A).

Figure 15B:
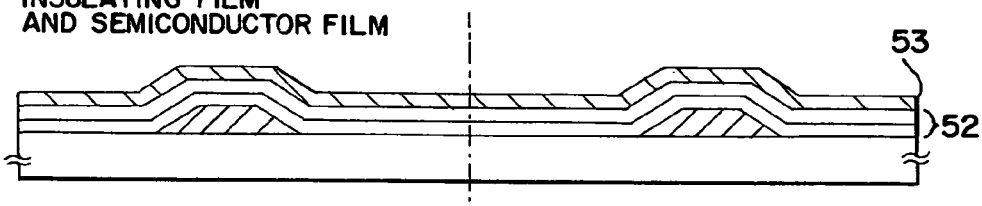

Then, a gate insulating film 52 is formed. The gate insulating film may have a single-layer structure of a silicon oxide film, a silicon nitride film, or a silicon oxynitride film, or a multi-layer structure of any of these films (FIG. 15B).

Figure 15C:
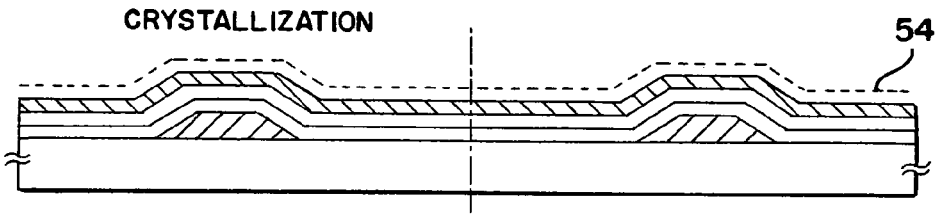

Then, an amorphous silicon film 53 is formed into a thickness of 10 to 150 nm as an amorphous semiconductor film by thermal CVD, plasma CVD, low-pressure CVD, vapor deposition, or sputtering. The gate insulating film 52 and the amorphous silicon film 53 can be formed by the same method, so that they may be formed continuously. By continuously forming the gate insulating film 52 and the amorphous silicon film 53, the surface thereof is not exposed to the atmosphere and can be prevented from being contaminated, and variations in characteristics of a TFT to be manufactured or changes in a threshold voltage can be reduced (FIG. 15C).

The amorphous silicon film 53 is coated with a catalytic element for promoting crystallization, whereby a catalytic element containing layer 54 is formed. Then, a heat treatment is conducted to form a crystalline silicon film 55.

Figure 15D:
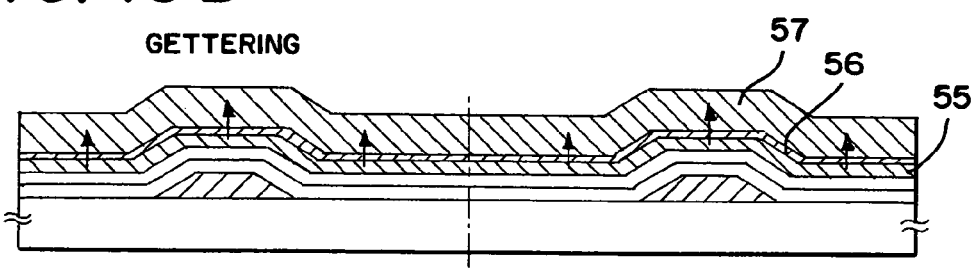
Figure 15E:
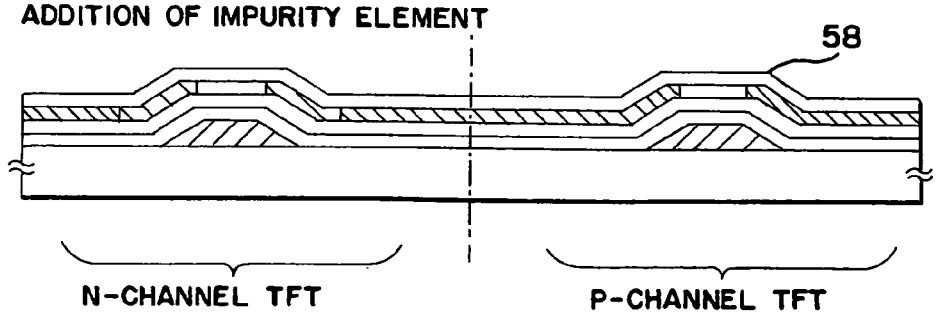
Figure 16A:
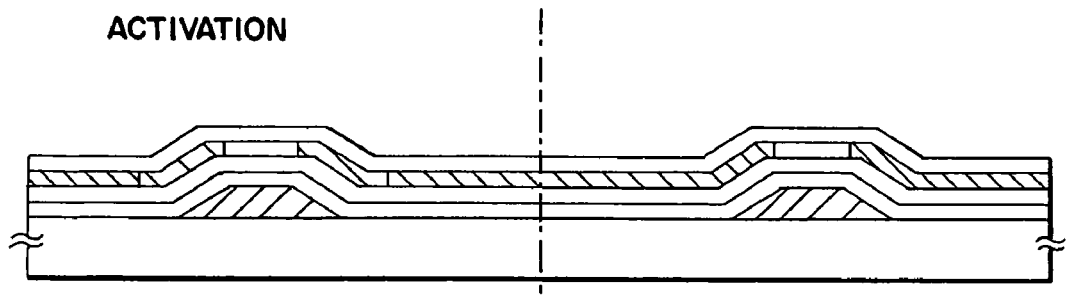
FIGS. 16A to 16C illustrate an embodiment of the present invention.
Figure 16B:
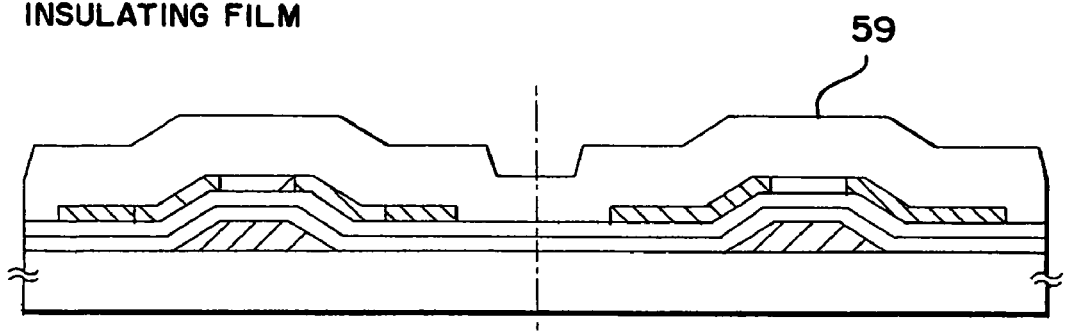
Figure 16C:
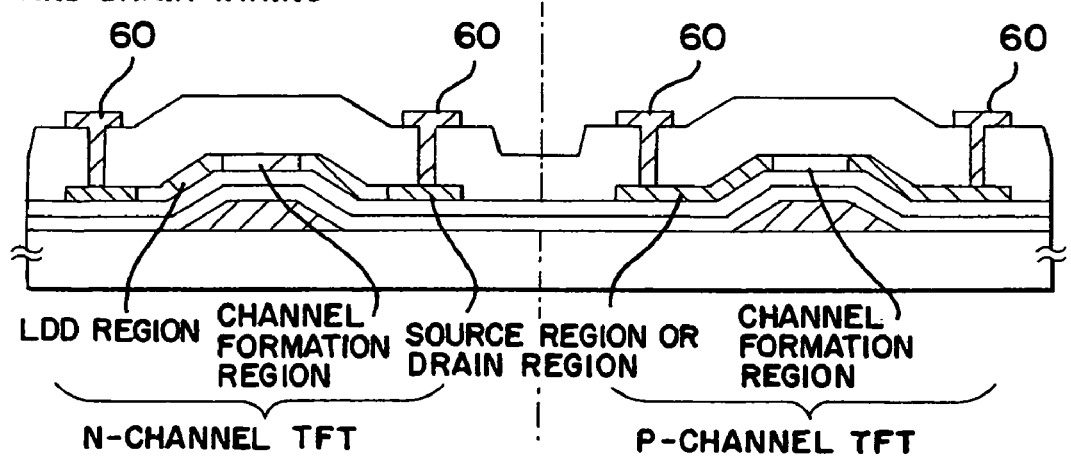

After crystallization, a barrier layer 56 is formed on the crystalline silicon film 55. As the barrier layer 56, films as described in Embodiment Mode 1 may be used. In the present embodiment a porous film is formed, which is capable of allowing a catalytic element (nickel) to pass therethrough to a gettering site, and preventing an etchant used for removing the gettering site from permeating thereto. Alternatively, a chemical oxide film is formed by a treatment with ozone water (FIG. 15D).

Then, a semiconductor film 57 containing a rare gas element is formed as a gettering site. In the present embodiment the semiconductor film 57 containing a rare gas element in a concentration of $1\times10^{19}$ to $1\times10^{22}/cm^3$, preferably $1\times10^{20}$ to $1\times10^{21}/cm^3$, more preferably $5\times10^{20}/cm^3$ is formed under the conditions of an Ar flow rate of 50 sccm, a film formation pressure of 0.2 Pa, a power of 3 kW, and a substrate temperature of 150° C.

A heat treatment is then conducted for the purpose of moving (gettering) a catalytic element from the crystalline semiconductor film 55 to the gettering site 57. The heat treatment may be conducted by RTA or furnace annealing. Due to the heat treatment, the concentration of the catalytic element in the crystalline semiconductor film 55 can be reduced to $1\times10^{17}/cm^3$ or less.

After gettering, the gettering site 57 and the barrier layer 56 are removed.

Then, an insulating film 58 for protecting the crystalline silicon film (channel formation region) in the latter process of adding impurities is formed into a thickness of 100 to 400 nm. The insulating film 58 is formed for the purpose of preventing the crystalline silicon film from being directly exposed to plasma when impurities are added, and minutely controlling the concentration of impurities An n-type impurity element is then added to the crystalline silicon film to be an active layer of an n-channel TFT and a p-type impurity element is added to the crystalline silicon film to be an active layer of a p-channel TFT, using a resist mask, whereby a source region, a drain region, and an LDD region are formed.

Then, the impurity elements added to the crystalline silicon film are activated. Then, the insulating film 58 on the crystalline silicon film is removed, and the crystalline silicon film is patterned to a desired shape. Thereafter, an interlayer insulating film 59 is formed. The interlayer insulating film 59 is formed of an insulating film such as a silicon oxide film, a silicon nitride film, a silicon oxynitride film, or the like into a thickness of 500 to 1500 nm. Then, contact holes reaching the source region or the drain region of each TFT are formed, and a wiring 60 for electrically connecting respective TFTs to each other is formed.

As described above, the present invention is applicable irrespective of the shape of a TFT.

Embodiment 3

Figure 10:
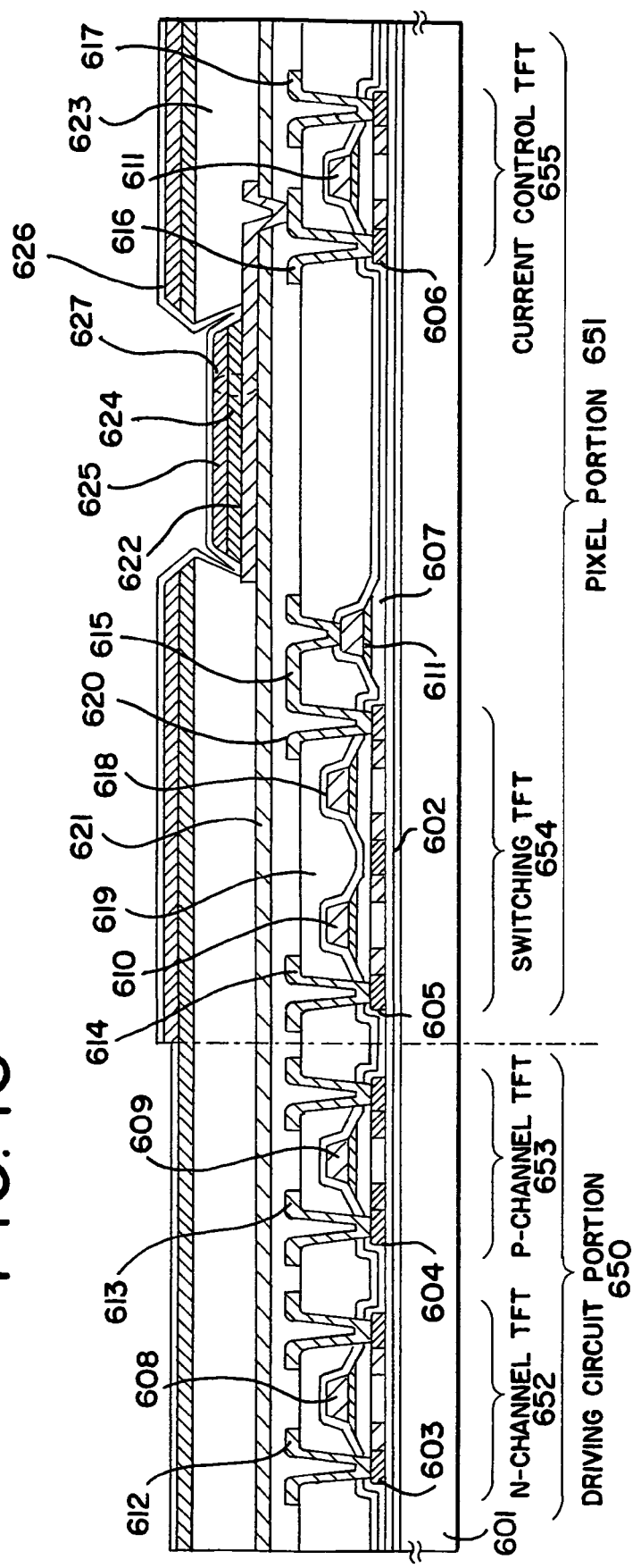
FIG. 10 shows an example of a light-emitting device manufactured by using the present invention.

FIG. 10 shows an example of a configuration of an active matrix driving type light-emitting device. An n-channel TFT 652 and a p-channel TFT 653 of a driving circuit portion 650, and a switching TFT 654 and a current control TFT 655 of a pixel portion 651 shown in FIG. 10 are manufactured in the same way as in Embodiment 1 according to the present invention.

A first interlayer insulating film 618 made of silicon nitride and silicon oxynitride is formed on the upper surface of gate electrodes 608 to 611, and used as a protecting film. Furthermore, a second interlayer insulating film 619 made of an organic resin material such as polyimide or acrylic resin is formed as a flattening film.

The circuit configuration of the driving circuit portion 650 is varied between a gate signal side driving circuit and a data signal side driving circuit; however, the description thereof will be omitted here. Wirings 612 and 613 are connected to an n-channel TFT 652 and a p-channel TFT 653, and a shift register, a latch circuit, and a buffer circuit are formed using these TFTs.

In the pixel portion 651, a data wiring 614 is connected to a source side of the switching TFT 654, and a wiring 615 on the drain side is connected to a gate electrode 611 of the current control TFT 655. Furthermore, a source side of the current control TFT 655 is connected to a power source supply wiring 617, and an electrode 616 on the drain side is connected to an anode of a light-emitting element.

On the above-mentioned wirings, a third interlayer insulating film 620 made of an organic insulating material such as silicon nitride is formed. The organic resin material occludes $H_2O$ due to its hygroscopicity. When $H_2O$ thereof is released again, $H_2O$ supplies oxygen to an organic compound to degrade an organic light-emitting element. Therefore, in order to prevent occlusion and release of $H_2O$, a fourth insulating film 621 made of silicon nitride or silicon oxynitride is formed on the third interlayer insulating film 620. Alternatively, it may also be possible that the third interlayer insulating film 620 is omitted, and only the fourth insulating film 621 is formed.

An organic light-emitting element 627 is formed on the fourth insulating film 621, and is composed of an anode 622 made of a transparent conductive material such as ITO (indium tin oxide), an organic compound layer 624 having a hole injection layer, a hole transport layer, a light-emitting layer, and the like, and a cathode 625 made of alkali metal such as MgAg or LiF or alkaline-earth metal. The configuration of the organic compound layer 624 may be arbitrarily determined.

The organic compound layer 624 and the cathode 625 cannot be subjected to a wet treatment (i.e., etching with a drug solution or washing with water), so that a partition layer 623 made of a photosensitive resin material is provided on the fourth insulating film 621 in conformity with the anode 622. The partition layer 623 is formed so as to cover the ends of the anode 622. More specifically, the partition layer 623 is formed by coating of a negative resist, followed by baking so as to have a thickness of about 1 to 2 μm. Thereafter, the negative resist is exposed to light by irradiation with UV-rays using a photomask with a predetermined pattern. If a negative resist material with poor transmittance is used, the photo sensitizing ratio of the resist material is varied in the thickness direction of the film. If such a resist material is developed, the ends of the pattern can be made reversely tapered. Needless to say, such a partition layer can be formed by using photosensitive polyimide and the like.

A material containing magnesium (Mg), lithium (Li), or calcium (Ca) having a small work function is used for the cathode 625. Preferably, an electrode made of MgAg (material obtained by mixing Mg with Ag at a ratio of 10:1) maybe used. Alternatively, a MgAgAl electrode, a LiAl electrode, or a LiFAl electrode can be used. On the cathode 625, a fifth insulating film 626 is formed of silicon nitride or a DLC film to a thickness of 2 to 30 nm, preferably 5 to 10 nm. The DLC film can be formed by plasma CVD. Even when the DLC film is formed at 100° C. or lower, the DLC film can be formed so as to cover the ends of the partition layer 623 with good coverage. The internal stress of the DLC film can be alleviated by mixing a small amount of oxygen or nitrogen, and the DLC film can be used as a protective film. It is known that the DLC film has a high gas barrier property with respect to oxygen, CO, $CO_2$, $H_2O$, and the like. It is desired that the fifth insulating film 626 be formed continuously after formation of the cathode 625 without being exposed to the atmosphere. This is because the state of the interface between the cathode 625 and the organic compound layer 624 largely influences a light-emitting efficiency of an organic light-emitting element.

Thus, the organic light-emitting element is obtained by forming the organic compound layer 624 and the cathode layer 625 without bringing them into contact with the partition layer 623, whereby cracks are prevented from being generated due to heat stress. Furthermore, since the organic compound layer 624 is weakest to oxygen and $H_2O$, the silicon nitride film, the silicon oxynitride film, or the DLC film 626 is formed so as to block oxygen and $H_2O$. Furthermore, these films also have a function of preventing alkali metal elements of the organic compound layer 624 from being released therefrom.

In FIG. 10, the switching TFT 654 has a multi-gate structure, and in the current control TFT 655, an LDD is provided so as to be overlapped with a gate electrode. A TFT using polycrystalline silicon exhibits a high operation speed, so that degradation of injection of hot carriers and the like is likely to occur. Therefore, it is very effective for manufacturing a highly reliable display device capable of displaying a satisfactory image (having high operation performance) to form TFTs (i.e., a switching TFT having a sufficiently low off-current and a current control TFT resistant to injection of hot carriers) having different structures in accordance with a function in a pixel.

As shown in FIG. 10, a base insulating film 602 is formed under (on the substrate 601 side of) the semiconductor film in which TFTs 654 and 655 are formed. A first interlayer insulating film 618 is formed above the semiconductor film. On the other hand, a fourth insulating film 621 is formed under the organic light-emitting element 627. A fifth insulating film 626 is formed above the organic light-emitting element 627. It is considered that alkali metal such as sodium to which the TFTs 654 and 655 are weakest is generated from the substrate 601 and the organic light-emitting element 627. The alkali metal is blocked by surrounding the TFTs 654 and 655 with the base insulating film 602 and the first interlayer insulating film 618. The organic light-emitting element 627 is weakest to oxygen and $H_2O$, so that the fourth insulating film 621 and the fifth insulating film 626 are formed so as to block them. The fourth and fifth insulating films 621 and 626 have a function of preventing alkali metal elements of the organic light-emitting element 627 from being released therefrom.

As an example of an effective method of manufacturing an organic light-emitting device with a structure as shown in FIG. 10, a process may be adopted in which the fourth insulating film 621 and the cathode 622 made of a transparent conductive film such as ITO are continuously formed by sputtering. In order to form a refined silicon nitride film or silicon oxynitride film without remarkably damaging the surface of the second interlayer insulating film 619 made of an organic insulating film, sputtering is suitable.

As described above, a pixel portion is formed by combining TFTs and the organic light-emitting device, whereby the light-emitting device can be completed. In such a light-emitting device, a driving circuit can also be formed on the same substrate, using a TFT. By surrounding the lower layer side and upper layer side of the semiconductor film, the gate insulating film, and the gate electrode that are main constituent elements of a TFT by a blocking layer made of silicon nitride or silicon oxynitride and a protective film, contamination with alkali metal and an organic substance can be prevented. On the other hand, the organic light-emitting element contains alkali metal in a part thereof, and is surrounded by a protective film made of silicon nitride or silicon oxynitride and a gas barrier layer made of an insulating film containing silicon nitride or carbon as its main component, whereby oxygen and $H_2O$ are prevented from entering from outside.

Thus, by applying the gettering method of the present invention, a satisfactory crystalline semiconductor film can be formed. Furthermore, by manufacturing a TFT with the use of such a semiconductor film, a TFT with satisfactory characteristics can be manufactured. Furthermore, according to the present, invention, TFTs having different characteristics demanded by the driving circuit and the pixel portion can be formed, and a light-emitting device capable of conducting a satisfactory display can be completed.

Embodiment 4

Figure 18:
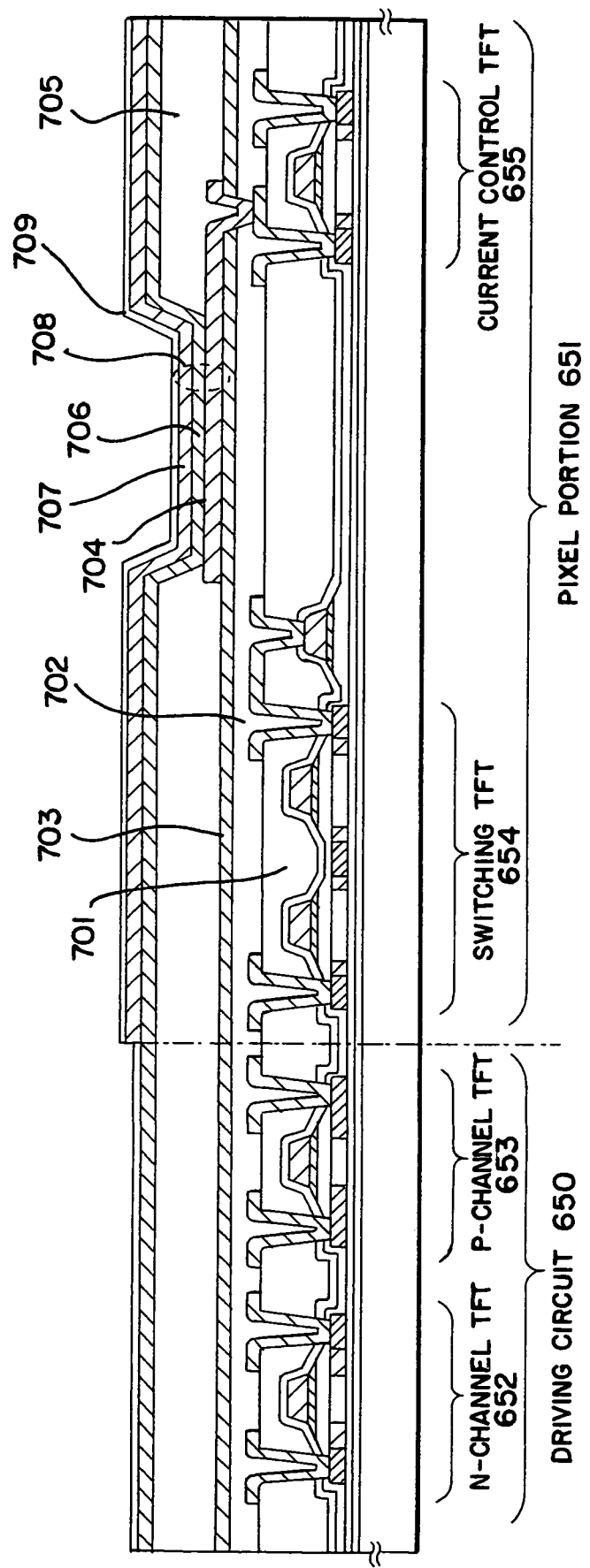
FIG. 18 shows an example of a light-emitting device manufactured by using the present invention.

Herein, an example of manufacturing processes of a light-emitting device different from that of Embodiment 3 will be described with reference to FIG. 18.

In the same way as in Embodiment 3 according to the present invention, the first interlayer insulating film 618 is formed. Then, a second interlayer insulating film 701 is formed. As the second interlayer insulating film 701, an inorganic insulating material may be formed into a film with an average thickness of 1.0 to 2.0 µm. As the inorganic resin material, a silicon oxide film or a silicon oxynitride film may be formed of an organic resin material by known sputtering or plasma CVD. In the case of using a silicon oxynitride film, the film may be formed by a plasma CVD apparatus, using $SiH_4$ and $N_2O$ as a raw material gas, under the conditions of a pressure of 0.3 torr, a substrate temperature of 400° C., an RF output of 100 W, an $SiH_4$ flow rate of 4 sccm, and an $N_2O$ flow rate of 400 sccm. Furthermore, as the second interlayer insulating film 701, a SOG film may be used. Furthermore, the second interlayer insulating film may be manufactured by using an organic insulating film made of acrylic resin or the like.

In the case where the second interlayer insulating film 701 is formed of an inorganic insulating film, it is preferable that the surface of the second interlayer insulating film 701 is polished by a technique called chemical mechanical polish (CMP) to be flattened. The CMP method is a procedure of chemically or mechanically flattening the surface based on the surface of a substance to be treated as a reference. Generally, polishing cloth or a polishing pad (in the present specification, collectively referred to as a "pad") is attached to a platen or polishing plate, the platen or polishing plate and a substance to be treated are rotated or shaken respectively while a slurry is supplied between the substance to be treated and the pad, whereby the surface of the substance to be treated is polished by chemical and mechanical function. After completion of flattening by the CMP method, the average thickness of the second interlayer insulating film 701 is set to be about 1.0 to 2.0 µm.

Then, a third insulating film 702 and a fourth insulating film 703 are formed in accordance with Embodiment 3. The fourth insulating film 703 made of silicon nitride or silicon oxynitride protects a semiconductor film that is a main constituent element of a TFT from being contaminated with alkali metal and an organic substance contained in an organic compound layer 706, and protects the organic compound layer 706 that degrades due to oxygen and moisture.

Next, a transparent conductive film is formed into a thickness of 80 to 120 nm on the fourth insulating film 703, followed by etching to form an anode 704. In the present embodiment as a transparent electrode, a transparent conductive film is used, which is obtained by mixing 2 to 20% zinc oxide (ZnO) in an ITO film or an indium oxide film.

In order to form a partition layer 705, a resist film, a polyimide film, a polyamide film, an acrylic film, a benzocyclobutene (BCB) film, a silicon oxide film, or the like is formed. The partition layer 705 may be made of an organic material or an inorganic material as long as the material has an insulating property. In the case of forming the partition layer 705, using photosensitive acrylic resin, it is preferable that a heat treatment is conducted at 180° C. to 350° C. after the photosensitive acrylic film is etched. Furthermore, in the case of forming the partition layer 705, using a non-photosensitive acrylic film, it is preferable that a heat treatment is conducted at 180° C. to 350° C., followed by etching to form the partition layer 705. Furthermore, in the case of using a silicon oxide film, the film may be formed by CVD.

Then, an organic compound layer 706 and a cathode 707 are formed on the anode 704 and the partition layer 705 by vapor deposition. In the present embodiment although an MgAg electrode is used as a cathode of a light-emitting element, other known materials may be used. The organic compound layer 706 is formed by combining a plurality of layers such as a hole injection layer, a hole transport layer, an electron transport layer, an electron injection layer, and a buffer layer in addition to the light-emitting layer to be laminated. The specific configuration of the organic compound layer 706 can be arbitrarily determined.

Accordingly, an organic light-emitting element 708 composed of the anode 704, the organic compound layer 706, and the cathode 707 is formed.

Then, in accordance with Embodiment 3, a fifth insulating film 709 is formed of an insulating film such as a DLC film. Thus, a light-emitting device with the partition layer tapered can be manufactured as shown in FIG. 18.

As described above, a satisfactory crystalline semiconductor film can be formed by applying the gettering method of the present invention, and a TFT with satisfactory characteristics can be manufactured by using such a semiconductor film. Furthermore, according to the present invention, TFTs having different characteristics demanded by the driving circuit and the pixel portion can be formed, and a light-emitting device capable of conducting a satisfactory display can be completed.

Embodiment 5

In the present embodiment results obtained by measuring reliability and electrical characteristics of a TFT manufactured according to the present invention will be shown.

Figure 19A:
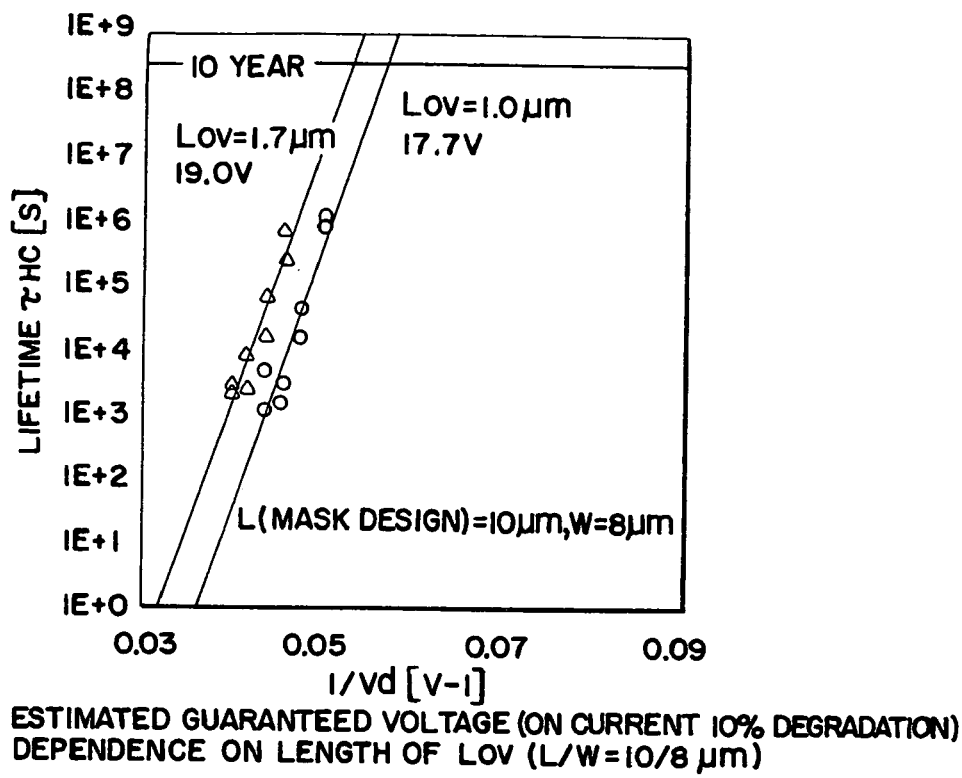
FIGS. 19A and 19B are graphs showing results obtained by measuring the reliability and characteristics of a TFT manufactured by using the present invention.

FIG. 19A shows results obtained by measuring reliability of an n-channel TFT.

The applicants of the present invention evaluate the reliability thereof by checking a 10-year guarantee voltage. Herein, a 10-year guarantee voltage is obtained by plotting a reciprocal number of a stress voltage in a semilogarithmic graph, and estimating a stress voltage of which a lifetime is 10 years from the obtained linear relationship, assuming that the time period up to the moment when the maximum value ($\mu FE_{(max)}$) of the mobility of a TFT is varied by 10% is a lifetime. When a TFT (driving circuit) manufactured according to the present invention is measured, a 10-year guarantee voltage is 17.7 volts when the length of $L_{ov}$ is 1.0 µm and 19.0 volts when the length of $L_{ov}$ is 1.7 µm, as shown in FIG. 19A. Thus, the TFT thus manufactured exhibited high reliability.

Figure 19B:
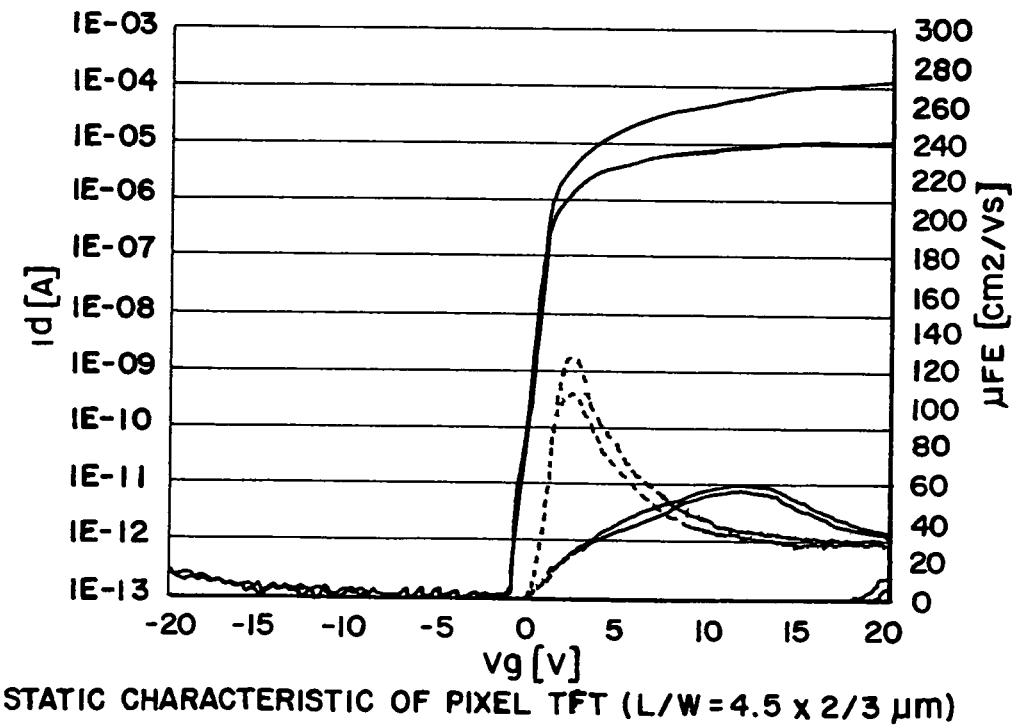

Furthermore, FIG. 19B shows an $I_d$-$V_g$ curve of the TFT manufactured according to the present invention. Measurement was conducted under the conditions that a source voltage ($V_s$) is 0 volt, and a drain voltage ($V_d$) is 1 volt or 14 volts. Actually measured values are as follows: a pixel TFT has a channel length (L) of 4.5×2 µm and a channel width (W) of 3 µm.

The pixel TFT has an off current ($I_{off}$) suppressed to 1 pA or less, and quick and sharp rise of $I_{off}$ when $V_g$ is high was suppressed. Furthermore, satisfactory characteristics could be obtained in which the field-effect mobility is 100 to 130 (cm$^2$/Vs), and an S-value is 0.174 to 0.185 (V/dec).

It is understood from the above results that highly reliable TFTs with desired performance can be manufactured, having different structures, without increasing the number of processes.

Embodiment 6

The CMOS circuit and the pixel portion formed by implementing the present invention can be used in active matrix type display, (liquid crystal display device). That is, the present invention can be implemented in all of electronic apparatus integrated with the liquid crystal display device at display portions thereof.

As such electronic apparatus, there are pointed out a video camera, a digital camera, a projector (rear type or front type), a head mount display (goggle type display), a personal computer, a portable information terminal (mobile computer, portable telephone or electronic book) and the like. Examples of these are shown in FIGS. 11, 12 and 13.

Figure 11A:
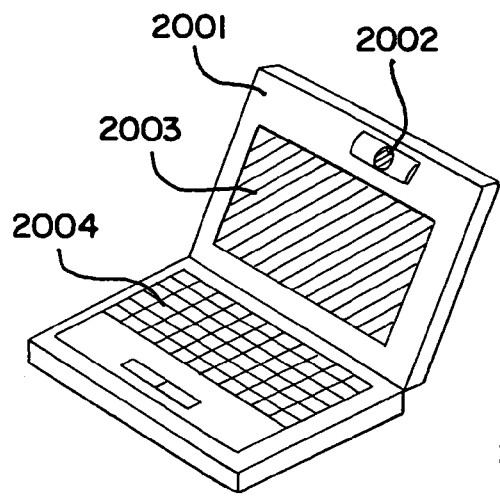
FIGS. 11A to 11F show exemplary electrical equipment utilizing, in a display portion, a liquid crystal display device manufactured by using the present invention.

FIG. 11A shows a personal computer including a main body 2001, an image input portion 2002, a display portion 2003 and a keyboard 2004.

Figure 11B:
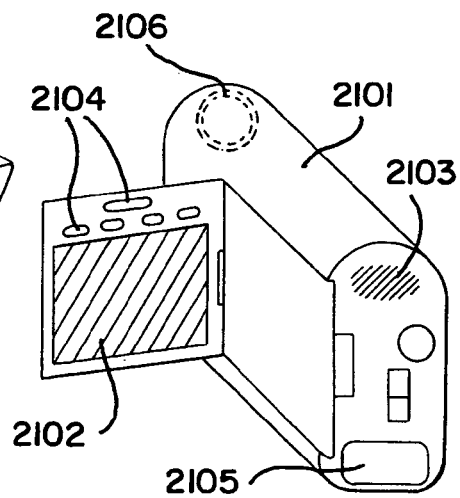

FIG. 11B shows a video camera including a main body 2101, a display portion 2102, a voice input portion 2103, operation switches 2104, a battery 2105 and an image receiving portion 2106.

Figure 11C:
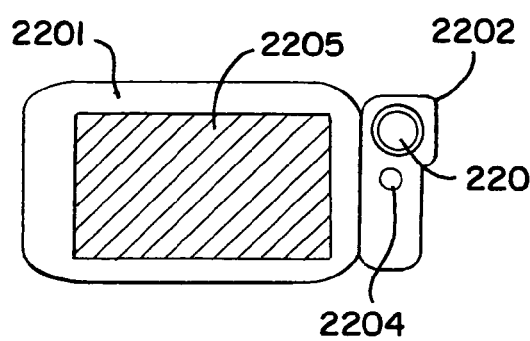

FIG. 11C shows a mobile computer including a main body 2201, a camera portion 2202, an image receiving portion 2203, an operation switch 2204 and a display portion 2205.

Figure 11D:
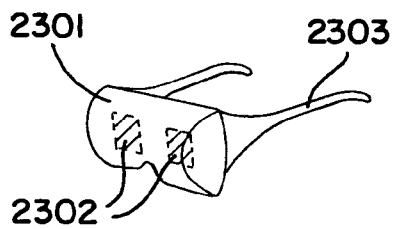

FIG. 11D shows a goggle type display including a main body 2301, a display portion 2302 and an arm portion 2303.

Figure 11E:
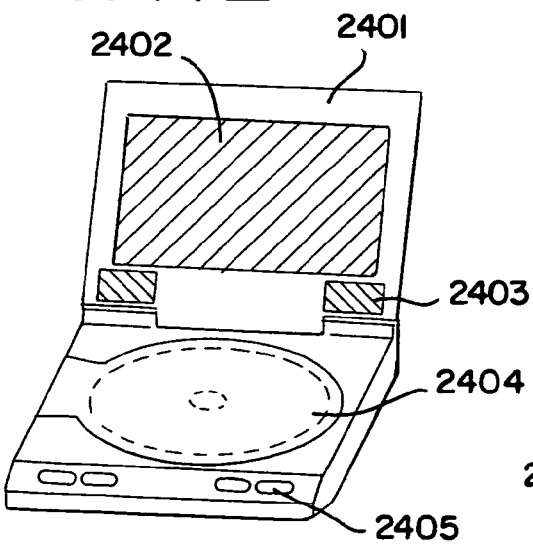

FIG. 11E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet.

Figure 11F:
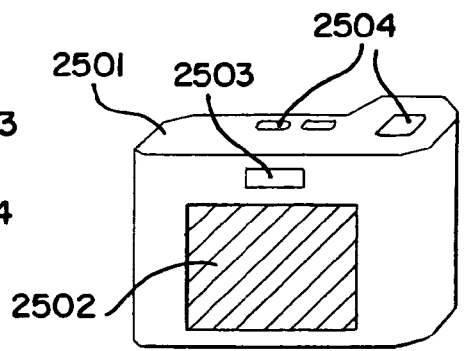

FIG. 11F shows a digital camera including a main body 2501, a display portion 2502, an eye contact portion 2503, operation switches 2504 and an image receiving portion (not illustrated).

Figure 12A:
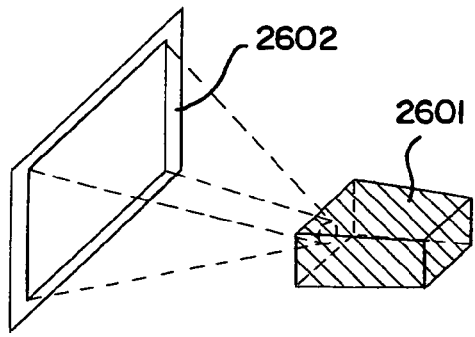
FIGS. 12A to 12D show exemplary electrical equipment utilizing, in a display portion, a liquid crystal display device manufactured by using the present invention.

FIG. 12A shows a front type projector including a projection apparatus 2601 and a screen 2602.

Figure 12B:
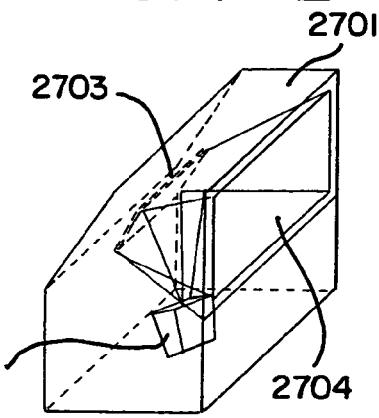

FIG. 12B shows a rear type projector including a main body 2701, a projection apparatus 2702, a mirror 2703 and a screen 2704.

Figure 12C:
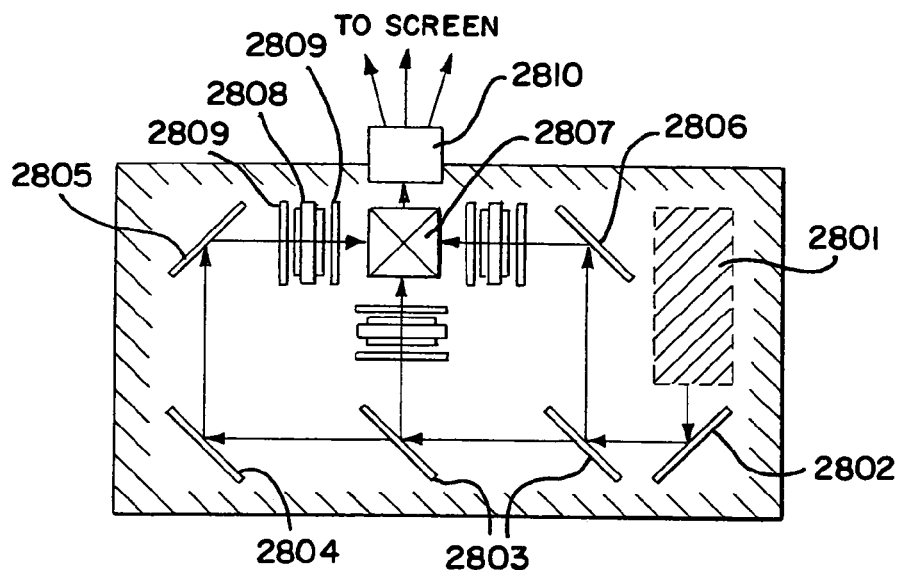

Further, FIG. 12C is a view showing an example of a structure of the projection apparatus 2601 and 2702 in FIG. 12A and FIG. 12B. The projection apparatus 2601 or 2702 is constituted by a light source optical system 2801, mirrors 2802, and 2804 through 2808, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 12C.

Figure 12D:
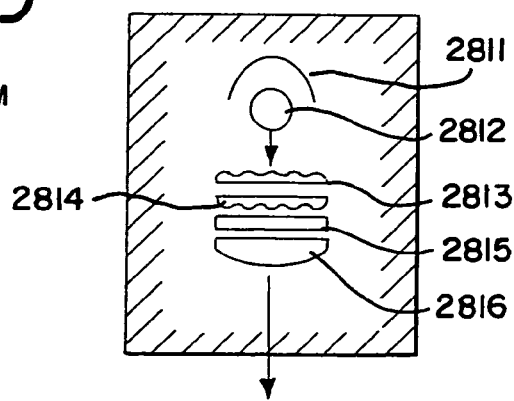

Further, FIG. 12D is a view showing an example of a structure of the light source optical system 2801 in FIG. 12C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 12D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 12, there is shown a case of using a transmission type electro-optic apparatus and an example of applying a reflection type liquid crystal display device is not illustrated.

Figure 13A:
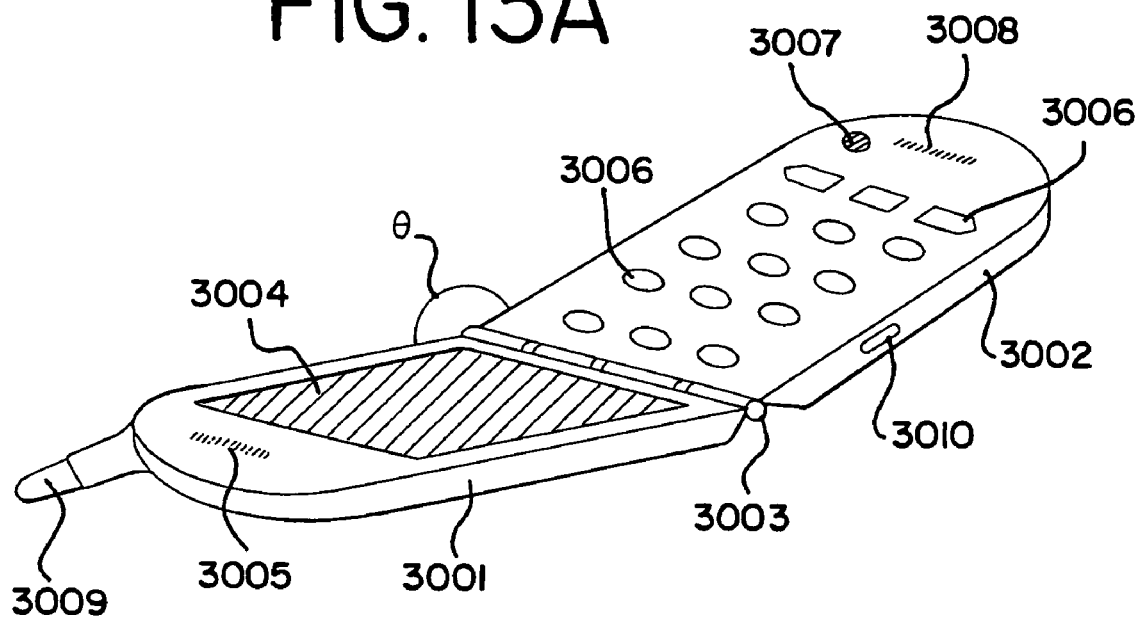
FIGS. 13A to 13C show exemplary electrical equipment utilizing, in a display portion, a liquid crystal display device manufactured by using the present invention.

FIG. 13A shows a portable telephone including a display panel 3001, an operation panel 3002. The display panel 3001 and the operation panel 3002 is connected to each other in the connecting portion 3003. In the connecting panel 3003, the angle θ of a face which is provided the display portion 3004 of the display panel 3001 and a face which is provided the operation key 3006 of the operation panel 3002 can be changed arbitrary. Further, a voice output portion 3005, an operation key 3010, a power source switch 3007, a sound input portion 3008 and an antenna 3009 are also included.

Figure 13B:
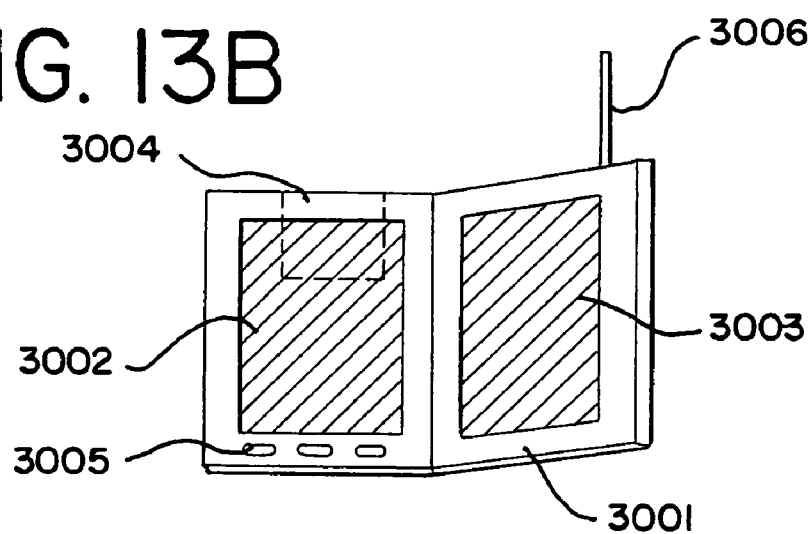

FIG. 13B shows a portable book (electronic book) including a main body 3001, display portion 3002, 3003, a record medium 3004, an operation switch 3005 and an antenna 3006.

Figure 13C:
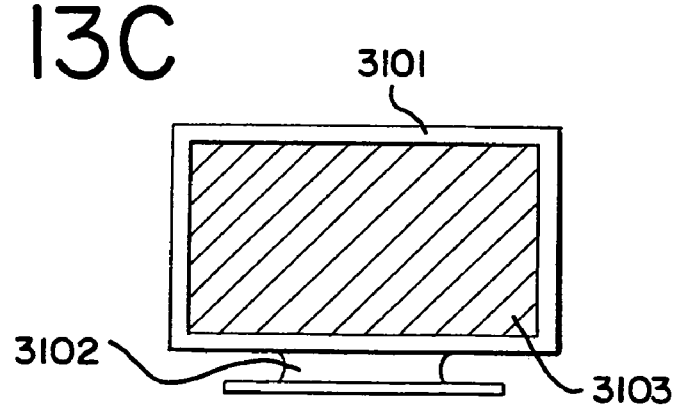

FIG. 13C shows a display including a main body 3101, a support base 3102 and a display portion 3103.

As has been described, the range of applying the invention is extremely wide and is applicable to electronic apparatus of all the fields. The electronic apparatus of the present invention can be implemented by freely combined with Embodiment modes 1 to 4 and Embodiments 1 and 2.

According to the present invention, when a semiconductor film is crystallized at a low temperature, using a catalytic element for promoting crystallization, the catalytic element can be effectively removed from the semiconductor film or the concentration of the catalytic element can be reduced. Furthermore, since a rare gas element used for gettering is inactive in the semiconductor film, the element does not involve adverse effect such as fluctuations in a threshold voltage of a TFT.

Furthermore, according to the present invention, an n-channel TFT and a p-channel TFT having different LDD structures can be formed on the same substrate by using 6 photomasks. By using such an active matrix substrate, a liquid crystal display device and a display device having a light-emitting layer on the same substrate can be formed.

The decrease in number of photomasks enhances productivity, but furthermore, according to the present invention, by optimizing an LDD structure of an n-channel TFT as described above, reliability and operation characteristics of an active matrix substrate can be simultaneously enhanced.

As described above, by using a semiconductor film with the concentration of a catalytic element sufficiently reduced as an active layer, characteristics of a TFT are enhanced, and by manufacturing the TFT by the method disclosed in the present invention, a semiconductor device and a liquid crystal display device with high performance can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of manufacturing a semiconductor device comprising the steps of:

forming a first semiconductor island and a second semiconductor island over a substrate;

forming a gate insulating film on the first semiconductor island and the second semiconductor island;

forming first and second gate electrodes over the first semiconductor island and a third gate electrode over the second semiconductor island each comprising a first conductive layer and a second conductive layer, wherein ends of the second conductive layer are tapered;

doping first impurity elements to the first semiconductor island and the second semiconductor island using the first and second gate electrodes and the third gate electrode as masks in a self-alignment manner;

forming a first resist mask so as to cover the first gate electrode and a portion of the first semiconductor island doped with the first impurity elements, and a second resist mask so as to cover the second gate electrode and another portion of the first semiconductor island doped with the first impurity elements; and doping second impurity elements to the first semiconductor island doped with the first impurity elements and the second semiconductor island doped with the first impurity elements using the first and second resist masks and the third gate electrode as masks, wherein the second semiconductor island is doped in a self-alignment manner.

2. The method of manufacturing the semiconductor device according to claim 1, wherein the semiconductor device is one selected from the group consisting of a personal computer, a video camera, a mobile computer, a goggle type display, a player using a record medium, a digital camera, a front type projector a rear type projector, a portable telephone and an electronic book.

3. A method of manufacturing a semiconductor device comprising the steps of:

forming a first semiconductor island for a first thin film transistor in a pixel portion and a second semiconductor island for a second thin film transistor in a driver circuit over a substrate;

forming a gate insulating film on the first semiconductor island and the second semiconductor island;

forming first and second gate electrodes over the first semiconductor island and a third gate electrode over the second semiconductor island each comprising a first conductive layer and a second conductive layer, wherein ends of the second conductive layer are tapered;

doping first impurity elements to the first semiconductor island and the second semiconductor island using the first and second gate electrodes and the third gate electrode as masks in a self-alignment manner;

forming a first resist mask so as to cover the first gate electrode and a portion of the first semiconductor island doped with the first impurity elements, and a second resist mask so as to cover the second gate electrode and another portion of the first semiconductor island doped with the first impurity elements; and doping second impurity elements to the first semiconductor island doped with the first impurity elements and the second semiconductor island doped with the first impurity elements using the first and second resist masks and the third gate electrode as masks, wherein the second semiconductor island is doped in a self-alignment manner.

4. The method of manufacturing the semiconductor device according to claim 3, wherein the driver circuit is a buffer circuit.

5. The method of manufacturing the semiconductor device according to claim 3, wherein the semiconductor device is one selected from the group consisting of a personal computer, a video camera, a mobile computer, a goggle type display, a player using a record medium, a digital camera, a front type projector a rear type projector, a portable telephone and an electronic book.

6. A method of manufacturing a semiconductor device comprising the steps of:

forming a first semiconductor island, a second semiconductor island and a third semiconductor island over a substrate;

forming a gate insulating film on the first semiconductor island, the second semiconductor island and the third semiconductor island;

forming first and second gate electrodes over the first semiconductor island, a third gate electrode over the second semiconductor island and a fourth gate electrode over the third semiconductor island each comprising a first conductive layer and a second conductive layer, wherein ends of the second conductive layer are tapered;

doping first impurity elements to the first semiconductor island, the second semiconductor island and the third semiconductor island using the first and second gate electrodes, the third gate electrode and the fourth gate electrode as masks in a self-alignment manner;

forming a first resist mask so as to cover the first gate electrode and a portion of the first semiconductor island doped with the first impurity elements, and a second resist mask so as to cover the second gate electrode and another portion of the first semiconductor island doped with the first impurity elements;

doping second impurity elements to the first semiconductor island doped with the first impurity elements and the second semiconductor island doped with the first impurity elements using the first and second resist masks and the third gate electrode as masks, wherein the second semiconductor island is doped in a self-alignment manner; and doping third impurity elements to the third semiconductor island doped with the first impurity elements using the fourth gate electrode as a mask.

7. The method of manufacturing the semiconductor device according to claim 6, wherein the semiconductor device is one selected from the group consisting of a personal computer, a video camera, a mobile computer, a goggle type display, a player using a record medium, a digital camera, a front type projector a rear type projector, a portable telephone and an electronic book.

8. A method of manufacturing a semiconductor device comprising the steps of:

forming a first semiconductor island and a second semiconductor island over a substrate;

forming a gate insulating film on the first semiconductor island and the second semiconductor island;

forming first and second gate electrodes over the first semiconductor island and a third gate electrode over the second semiconductor island each comprising a first conductive layer and a second conductive layer, wherein ends of the second conductive layer are tapered;

doping first impurity elements to the first semiconductor island and the second semiconductor island using the first and second gate electrodes and the third gate electrode as masks in a self-alignment manner;

forming a first resist mask so as to cover the first gate electrode and a portion of the first semiconductor island doped with the first impurity elements, and a second resist mask so as to cover the second gate electrode and another portion of the first semiconductor island doped with the first impurity elements;

doping second impurity elements to the first semiconductor island doped with the first impurity elements and the second semiconductor island doped with the first impurity elements using the first and second resist masks and the third gate electrode as masks, wherein the second semiconductor island is doped in a self-alignment manner;

forming a first insulating film on the first and second gate electrodes and the third gate electrode;

activating the first impurity elements and the second impurity elements in the first semiconductor island and the second semiconductor island;

forming a second insulating film on the first insulating film; and forming a first wiring and a second wiring connecting to the first semiconductor island and the second semiconductor island respectively.

9. The method of manufacturing the semiconductor device according to claim 8, wherein the semiconductor device is one selected from the group consisting of a personal computer, a video camera, a mobile computer, a goggle type display, a player using a record medium, a digital camera, a front type projector a rear type projector, a portable telephone and an electronic book.

10. A method of manufacturing a semiconductor device comprising the steps of:

forming a first semiconductor film over a substrate;

providing metal elements to the first semiconductor film;

crystallizing the first semiconductor film by heating the first semiconductor film to form a crystallized semiconductor film;

forming a barrier layer on the crystallized semiconductor film;

forming a second semiconductor film containing rare gas elements on the barrier layer;

heating the crystallized semiconductor film, the barrier layer and the second semiconductor film;

removing the second semiconductor film and the barrier layer;

forming a first semiconductor island and a second semiconductor island using the crystallized semiconductor film;

forming a gate insulating film on the first semiconductor island and the second semiconductor island;

forming first and second gate electrodes over the first semiconductor island and a third gate electrode over the second semiconductor island each comprising a first conductive layer and a second conductive layer;

doping first impurity elements to the first semiconductor island and the second semiconductor island using the first and second gate electrodes and the third gate electrode as masks; and doping second impurity elements to the first semiconductor island and the second semiconductor island using first and second resist masks covering the first and second gate electrodes respectively and the third gate electrode as masks.

11. The method of manufacturing the semiconductor device according to claim 10, wherein the semiconductor device is one selected from the group consisting of a personal computer, a video camera, a mobile computer, a goggle type display, a player using a record medium, a digital camera, a front type projector a rear type projector, a portable telephone and an electronic book.

* * * * *